United States Patent
Yao et al.

(10) Patent No.: US 11,042,091 B2
(45) Date of Patent: Jun. 22, 2021

(54) SPIN-ON INORGANIC OXIDE CONTAINING COMPOSITION USEFUL AS HARD MASKS AND FILLING MATERIALS WITH IMPROVED THERMAL STABILITY

(71) Applicant: Merck Patent GmbH, Darmstadt (DE)

(72) Inventors: Huirong Yao, Plainsboro, NJ (US); JoonYeon Cho, Bridgewater, NJ (US); M. Dalil Rahman, Monmouth Junction, NJ (US)

(73) Assignee: Merck Patent GmbH, Darmstadt (DE)

( * ) Notice: Subject to any disclaimer, the term of this patent is extended or adjusted under 35 U.S.C. 154(b) by 1 day.

(21) Appl. No.: 16/643,290

(22) PCT Filed: Sep. 4, 2018

(86) PCT No.: PCT/EP2018/073657
§ 371 (c)(1),
(2) Date: Feb. 28, 2020

(87) PCT Pub. No.: WO2019/048393
PCT Pub. Date: Mar. 14, 2019

(65) Prior Publication Data
US 2020/0356006 A1    Nov. 12, 2020

Related U.S. Application Data

(60) Provisional application No. 62/554,695, filed on Sep. 6, 2017.

(51) Int. Cl.
| | | |
|---|---|---|
| *C09D 7/61* | (2018.01) | |
| *G03F 7/11* | (2006.01) | |
| *C09D 185/00* | (2006.01) | |
| *G03F 7/16* | (2006.01) | |
| *H01L 21/033* | (2006.01) | |

(52) U.S. Cl.
CPC .............. *G03F 7/11* (2013.01); *C09D 7/61* (2018.01); *C09D 185/00* (2013.01); *G03F 7/162* (2013.01); *G03F 7/168* (2013.01); *H01L 21/0332* (2013.01); *H01L 21/0337* (2013.01)

(58) Field of Classification Search
CPC ............ C23C 18/1212; C23C 18/1216; C23C 18/1245; C23C 18/1295; C09D 185/00; C09D 7/61; G03F 7/11; G03F 7/162; G03F 7/168; H01L 21/0332; H01L 21/0337
USPC .... 252/79.1, 79.2, 79.3, 79.4; 438/694, 717; 430/330.331, 330, 331
See application file for complete search history.

(56) References Cited

U.S. PATENT DOCUMENTS

| | | |
|---|---|---|
| 2,888,367 A | 5/1959 | Greyson |
| 3,014,826 A | 12/1961 | Kohn et al. |
| 3,035,071 A | 5/1962 | Haslam |
| 3,474,054 A | 10/1969 | White |
| 3,625,934 A | 12/1971 | Rinse |
| 3,758,269 A | 9/1973 | Feigin |
| 4,200,729 A | 4/1980 | Calbo |
| 4,251,665 A | 2/1981 | Calbo |
| 4,347,347 A | 8/1982 | Yajima et al. |
| 4,361,691 A | 11/1982 | Yajima et al. |
| 4,416,789 A | 11/1983 | Shidlovsky et al. |
| 4,455,414 A | 6/1984 | Yajima et al. |
| 4,491,628 A | 1/1985 | Ito et al. |
| 4,529,766 A | 7/1985 | Starmer |
| 5,178,989 A | 1/1993 | Heller et al. |
| 5,187,019 A | 2/1993 | Calbo et al. |
| 5,350,660 A | 9/1994 | Urano et al. |
| 5,548,050 A | 8/1996 | Kushibiki et al. |
| 5,563,228 A | 10/1996 | Ogawa et al. |
| 5,772,978 A | 6/1998 | Bailey et al. |
| 5,843,624 A | 12/1998 | Houlihan et al. |
| 5,879,859 A | 3/1999 | Buchwalter et al. |

(Continued)

FOREIGN PATENT DOCUMENTS

| | | |
|---|---|---|
| CN | 1816575 A | 8/2006 |
| CN | 101796146 A | 8/2010 |

(Continued)

OTHER PUBLICATIONS

13707993—STIC STN Results, Relevant refs not used in 102, Aug. 3, 2015, 42 pages.

(Continued)

*Primary Examiner* — Lan Vinh
(74) *Attorney, Agent, or Firm* — William Thomas Slaven, IV

(57) ABSTRACT

The present invention relates to a composition comprising; components a. c. and d; and optional component b. wherein, component a. is a metal compound having the structure (I), optional component b., is a polyol additive, having structure (VI), component c. is a high performance polymer additive, and component d. is a solvent. The present invention further relates to using this compositions in methods for manufacturing electronic devices through either the formation of a patterned films of high K material comprised of a metal oxide on a semiconductor substrate, or through the formation of patterned metal oxide comprised layer overlaying a semiconductor substrate which may be used to selectively etch the semiconductor substrate with a fluorine plasma.

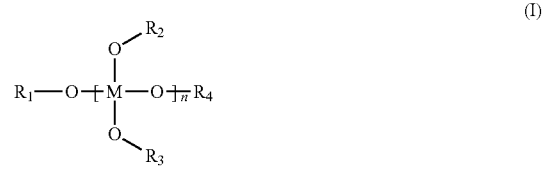

22 Claims, No Drawings

(56) References Cited

U.S. PATENT DOCUMENTS

| | | |
|---|---|---|
| 6,242,156 B1 | 6/2001 | Teng |
| 6,348,299 B1 | 2/2002 | Aviram et al. |
| 6,447,980 B1 | 9/2002 | Rahman et al. |
| 6,723,488 B2 | 4/2004 | Kudo et al. |
| 6,790,587 B1 | 9/2004 | Feiring et al. |
| 6,818,258 B2 | 11/2004 | Kaneko et al. |
| 6,849,377 B2 | 2/2005 | Feiring et al. |
| 6,866,984 B2 | 3/2005 | Jung et al. |
| 6,916,590 B2 | 7/2005 | Kaneko et al. |
| 7,416,834 B2 | 8/2008 | Abdallah et al. |
| 7,560,580 B2 | 7/2009 | Shin et al. |
| 7,727,902 B2 | 6/2010 | Takei et al. |
| 7,767,368 B2 | 8/2010 | Fukushima et al. |
| 7,799,396 B2 | 9/2010 | Uehara et al. |
| 7,803,458 B2 | 9/2010 | Flaim et al. |
| 8,039,201 B2 | 10/2011 | Yao et al. |
| 8,202,573 B2 | 6/2012 | Pokorny et al. |
| 8,343,691 B2 | 1/2013 | Mizushima et al. |
| 8,367,771 B2 | 2/2013 | Shin et al. |
| 8,568,958 B2 | 10/2013 | Yao et al. |
| 9,296,922 B2 | 3/2016 | Yao et al. |
| 9,315,636 B2 | 4/2016 | Yao et al. |
| 2003/0235786 A1 | 12/2003 | Krishnamurthy et al. |
| 2004/0029041 A1 | 2/2004 | Shih et al. |
| 2004/0058275 A1 | 3/2004 | Neef et al. |
| 2004/0102048 A1 | 5/2004 | Yamaguchi |
| 2004/0181031 A1 | 9/2004 | Nogi et al. |
| 2004/0224616 A1 | 11/2004 | Shiho et al. |
| 2005/0027063 A1 | 2/2005 | Audenaert et al. |
| 2005/0164133 A1 | 7/2005 | Rangarajan et al. |
| 2006/0263708 A1 | 11/2006 | Wu et al. |
| 2007/0015083 A1 | 1/2007 | Babich et al. |
| 2007/0116640 A1 | 5/2007 | Kim et al. |
| 2007/0134916 A1 | 6/2007 | Iwabuchi et al. |
| 2007/0224483 A1 | 9/2007 | Alberti et al. |
| 2007/0243473 A1 | 10/2007 | Mizushima et al. |
| 2007/0260025 A1 | 11/2007 | Elder et al. |
| 2008/0044764 A1 | 2/2008 | Takahashi et al. |
| 2008/0076064 A1 | 3/2008 | Sun X |
| 2008/0076244 A1* | 3/2008 | Ye ............... H01L 21/76808 438/597 |
| 2009/0239080 A1 | 9/2009 | Ito et al. |
| 2009/0286188 A1 | 11/2009 | Hatakeyama et al. |
| 2010/0028804 A1 | 2/2010 | Iwato et al. |
| 2010/0099044 A1 | 4/2010 | Hatakeyama et al. |
| 2010/0130697 A1 | 5/2010 | Katayama et al. |
| 2011/0081615 A1 | 4/2011 | Kon |
| 2011/0207854 A1 | 8/2011 | Dominowski et al. |
| 2011/0207864 A1 | 8/2011 | Nakamura et al. |
| 2011/0213190 A1 | 9/2011 | Cazaux et al. |
| 2012/0178261 A1 | 7/2012 | Kanno et al. |
| 2012/0223418 A1 | 9/2012 | Stowers et al. |
| 2012/0264039 A1 | 10/2012 | Ito et al. |
| 2012/0288300 A1 | 11/2012 | Matsusaki et al. |
| 2012/0323008 A1 | 12/2012 | Barry et al. |
| 2012/0328990 A1 | 12/2012 | Yao et al. |
| 2013/0040140 A1 | 2/2013 | Joo et al. |
| 2013/0123137 A1 | 5/2013 | Reichardt et al. |
| 2014/0000948 A1 | 1/2014 | Nagai et al. |
| 2014/0087066 A1 | 3/2014 | Wang et al. |
| 2014/0159278 A1* | 6/2014 | Yao ............... C08G 79/00 264/212 |
| 2014/0273447 A1 | 9/2014 | Ogihara et al. |
| 2014/0356792 A1 | 12/2014 | Noya |
| 2015/0004801 A1 | 1/2015 | Rahman et al. |
| 2015/0024522 A1 | 1/2015 | Wang et al. |
| 2015/0064904 A1* | 3/2015 | Yao ............... H01L 21/0332 438/694 |
| 2016/0230019 A1 | 8/2016 | Yao et al. |

FOREIGN PATENT DOCUMENTS

| | | |
|---|---|---|
| EP | 1798599 A1 | 6/2007 |
| EP | 1892089 A1 | 2/2008 |
| EP | 2447775 A1 | 5/2012 |
| EP | 2479615 A1 | 7/2012 |
| JP | S6356529 A | 3/1988 |
| JP | H03138922 A | 6/1991 |
| JP | H0632756 A | 2/1994 |
| JP | 2000-10293 A | 1/2000 |
| JP | 2005-307101 A | 11/2005 |
| JP | 2006-098284 A | 4/2006 |
| JP | 2007-061720 A | 3/2007 |
| JP | 2009-173910 A | 8/2009 |
| WO | 2011/032837 A1 | 3/2011 |

OTHER PUBLICATIONS

International Preliminary Report on Patentability and Written Opinion received for PCT Application No. PCT/EP2014/067749, dated Mar. 10, 2016, Corresponds to U.S. Appl. No. 14/015,222, 7 pages.

International Preliminary Report on Patentability and Written Opinion received for PCT Patent Application No. PCT/IB2012/001219, dated Jan. 9, 2014, 7 pages.

International Preliminary Report on Patentability received for PCT Patent Application No. PCT/EP2018/073657, dated Mar. 19, 2020, 32 pages.

International Search Report and Written Opinion received for PCT Patent Application No. PCT/EP2013/075815 dated Jul. 9, 2014, 10 pages.

International Search Report and Written Opinion received for PCT Patent Application No. PCT/EP2014/06359315 dated Aug. 11, 2014, 7 pages.

International Search Report and Written Opinion received for PCT Patent Application No. PCT/EP2014/067749 dated Nov. 28, 2014, 8 pages.

International Search Report and Written Opinion received for PCT Patent Application No. PCT/EP2014/076919 dated Feb. 6, 2015, 13 pages.

International Search Report and Written Opinion received for PCT Patent Application No. PCT/EP2016/052167 dated May 20, 2016, 8 pages.

International Search Report and Written Opinion received for PCT Patent Application No. PCT/EP2018/073657, dated Jan. 15, 2019, 41 pages.

International Search Report and Written Opinion received for PCT Patent Application No. PCT/IB2012/001219 dated Oct. 19, 2012, 8 pages.

International Search Report and Written Opinion received for PCT Patent Application No. PCT/JP2012/070426 dated Sep. 4, 2012, 6 pages.

Non-Final Office Action received for U.S. Appl. No. 13/930,711, dated Mar. 31, 2015, 12 pages.

Non-Final Office Action received for U.S. Appl. No. 14/154,929, dated Jul. 10, 2015, 23 pages.

Non-Final Office Action received for U.S. Appl. No. 14/237,720, dated Mar. 11, 2015, 9 pages.

Non-Final Office Action received for U.S. Appl. No. 13/707,993, dated Aug. 27, 2015, 13 pages.

Notice of Allowance received for U.S. Appl. No. 13/164,869 dated Jun. 27, 2013, 6 pages.

Notice of Allowance received for U.S. Appl. No. 14/237,720, dated Jun. 24, 2015, 7 pages.

Office Action received for Chinese Patent Application No. 201280026263.9, dated Sep. 1, 2014, Corresponds to 13/164,869, 8 pages (5 pages of English Translation and 3 pages of Official Copy).

Office Action with Search Report received for Taiwan Patent Application No. 101122288 dated Jan. 26, 2016, Corresponds to 13/164,869, 7 pages.

Restriction Requirement received for U.S. Appl. No. 13/707,993, dated Mar. 12, 2015, 7 pages.

Restriction Requirement received for U.S. Appl. No. 14/015,222, dated May 11, 2015, 7 pages.

Abdallah, et al., "Image Reversal Trilayer Process Using Standard Positive Photoresist", Proceedings of SPIE, vol. 7273 72732K-1, 2009, pp. 1-9.

(56) References Cited

OTHER PUBLICATIONS

Bajuk-Bogdanovic, et al., "A Study of 12-Tungstosilicic Acid and 12-Molybdophosphoric Acids in Solution", Journal of the Serbian Chemical Society, vol. 73, No. 2, 2008, pp. 197-209.

Baxendale, et al., "The Reduction of Molybdenum(II) Trifluoroacetate by Pulse Radiolysis in Methanol1", Journal of the American Chemical Society, vol. 98, Jan. 21, 1976, pp. 637-638.

Burch, et al., "Scrambling of Fluoro-, Methoxyl, Dimethylamino-, and Methyl Groups with Chlorine Atoms and of Methoxyl with Dimethylamino-Groups on Germanium", Journal of the Chemical Society, 1966, pp. 586-589.

Jia, et al., "Multi-Dimensional Transition-Metal Coodination Polymers of 4,4-Bipyridine-N,N-dioxide: 1 D Chains and 2D Sheets", Inorganic Chemistry, vol. 47, No. 19, 2008, pp. 8652-8664.

Levy, et al., "Structure of Silico-Tungstic acid in Aqueous solution", The Journal of Chemical Physics, vol. 30, No. 6, Jun. 1959, pp. 1486-1488.

Lubben, et al., "Dioxygen Activation by Group 4 tritoxx Alkyls (tritox=t-Bu3CO-): Insertion and Oxygen Atom transfer", Journal of the American Chemical Society, vol. 109, 1987, pp. 424-435.

Meador, et al., "193-nm Multilayer Imaging Systems", proceedings of SPIE, vol. 5039, 2003, pp. 948-959.

Meador, et al., "New Materials for 193-nm Trilayer Imaging", proceedings of SPIE, vol. 5376, 2004, pp. 1136-1148.

Moss, et al., "Glossary of Class Names of Organic Compounds and Reactive Intermediates Based on Structure", Pure and Applied Chemistry, vol. 67, Nos. 8-9, 1995, pp. 1307-1375.

Paul, et al., "Zirconium(IV) Carboxylates", Australian Journal of Chemistry, vol. 29, 1976, pp. 1605-1607.

Piggot, et al., "Synthesis, Structure, and Magnetochemical Analysis of Selected First-Row Transition-Metal Anilino-and Anisolesquarate Compounds", Inorganic Chemistry, vol. 43, No. 3, 2004, pp. 1167-1174.

Pope, et al., "Polyoxymetalate Chemistry: An Old Field with New Dimensions in Several Disciplines", Angewandte Chemie, vol. 30, 1991, pp. 34-48.

Moon, et al., "Three-Component Photopolymers Based on Thermal Cross-Linking and Acidolytic De-Cross-Linking of Vinyl Ether Groups", Effects of Binder Polymers on Photopolymer Characterictics, Chemistry of Materials, vol. 6, 1994, pp. 1854-1860.

Sartori, et al., "Uber die Darstellung und Eigenschaften von Pertlouracyloxy-Verbindungen Der Vierten Gruppe des Periodensystems", Chemische Berichte, vol. 100, 1967, pp. 2049-2063.

Satterfield, et al., "Heterogeneous Catalysis in Industrial Practice", 2nd Edition, McGraw-Hill, Inc., New York, Chapter 1, 1991, pp. 1-30.

Schacht, et al., "Acid Labile Cross-Liked Units: A Concept for Improved Positive Deep-UV Photoresists", ACS Symposium Series, vol. 706, 1998, pp. 78-94.

Scroggie, et al., "The Crystal Structure of Anhydrous Sjucotungstic Acid and Related Compounds, and their Probable Molecular Formulas", Proceedings of the National Academy of Sciences vol. 15, No. 1, Jan. 15, 1929, pp. 1-8.

Yamaoka, et al., "Reactions of vinyl ethers and application to photoreactive process", Trends in Photochemistry ant Photobiology vol. 7, 2001, pp. 45-70.

Tao, et al., "Journal of Power Sources", vol. 135, 2004, pp. 267-272.

Zuniga, "Lithium Aryloxo Magnesiates: an Examination of Ligand Size and Donor Effects", Inorganic Chemistry, vol. 46, No. 24, 2007, pp. 10400-10409.

\* cited by examiner

SPIN-ON INORGANIC OXIDE CONTAINING COMPOSITION USEFUL AS HARD MASKS AND FILLING MATERIALS WITH IMPROVED THERMAL STABILITY

This application is a national stage application, filed under 35 U.S.C. § 371, of International Patent Application No. PCT/EP2018/073657, filed on Sep. 4, 2018, which claims the benefit of U.S. Provisional Patent Application No. 62/554,695, filed Sep. 6, 2017, each of which applications is incorporated herein by reference in their entirety.

FIELD OF INVENTION

The present invention relates to compositions comprising a soluble, multi-ligand-substituted metal compound, a high performance an optional polyol additive, and a solvent which are useful as air stable precursors to high K metal oxides. These precursors show improved void filling capacity for trench or via microlithographic features and can yield, after processing these filled lithographic features, a substrate containing a patterned high K metal oxide without employing chemical vapor deposition (CVD). These materials may also be used as hard mask materials.

BACKGROUND

Metal oxide films are useful in a variety of applications in the semiconductor industry such as, lithographic hard masks, underlayers for anti-reflective coatings and electro-optical devices.

As an example, photoresist compositions are used in microlithography processes for making miniaturized electronic components such as in the fabrication of computer chips and integrated circuits. Generally, a thin coating of a photoresist composition is applied to a substrate, such as a silicon wafer used for making integrated circuits. The coated substrate is then baked to remove a desired amount of solvent from the photoresist. The photoresist film on the substrate is then image-wise exposed to actinic radiation, such as, visible, ultraviolet, extreme ultraviolet, electron beam, particle beam and X-ray radiation and developed to form a pattern. The radiation causes a chemical transformation in the exposed areas of the photoresist. The exposed coating is treated with a developer solution to dissolve and remove either the radiation-exposed or the unexposed areas of the photoresist.

The trend towards the miniaturization of semiconductor devices has led to the use of new photoresists that are sensitive to shorter and shorter wavelengths of radiation and has also led to the use of sophisticated multilevel systems to overcome difficulties associated with such miniaturization.

Absorbing antireflective coatings and underlayers in photolithography are used to diminish problems that result from radiation that reflects from substrates which often are highly reflective. Reflected radiation results in thin film interference effects and reflective notching. Thin film interference, or standing waves, result in changes in critical line width dimensions caused by variations in the total light intensity in the photoresist film as the thickness of the photoresist changes. Interference of reflected and incident exposure radiation can cause standing wave effects that distort the uniformity of the radiation through the thickness. Reflective notching becomes severe as the photoresist is patterned over reflective substrates containing topographical features, which scatter light through the photoresist film, leading to line width variations, and in the extreme case, forming regions with complete loss of desired dimensions. An antireflective coating film coated beneath a photoresist and above a reflective substrate provides significant improvement in lithographic performance of the photoresist. Typically, the bottom antireflective coating is applied on the substrate and cured, followed by application of a layer of photoresist. The photoresist is imagewise exposed and developed. The antireflective coating in the exposed area is then typically dry etched using various etching gases, and the photoresist pattern is thus transferred to the substrate.

Underlayers containing high amount of refractory elements can be used as hard masks as well as antireflective coatings. Hard masks are useful when the overlying photoresist is not capable of providing high enough resistance to dry etching that is used to transfer the image into the underlying semiconductor substrate. In such circumstances a material called a hard mask is used whose etch resistance is high enough to transfer any patterns created over it into the underlying semiconductor substrate. This is made possible because the organic photoresist is different than the underlying hard mask and it is possible to find an etch gas mixture which will allow the transfer of the image in the photoresist into the underlying hard mask. This patterned hard mask can then be used with appropriate etch conditions and gas mixtures to transfer the image from the hard mask into the semiconductor substrate, a task which the photoresist by itself with a single etch process could not have accomplished.

Multiple antireflective layers and underlayers are being used in new lithographic techniques. In cases where the photoresist does not provide sufficient dry etch resistance, underlayers and/or antireflective coatings for the photoresist that act as a hard mask and are highly etch resistant during substrate etching are preferred. One approach has been to incorporate silicon, titanium or other metallic materials into a layer beneath the organic photoresist layer. Additionally, another high carbon content antireflective or mask layer may be placed beneath the metal containing antireflective layer, such as a trilayer of high carbon film/hard mask film/photoresist is used to improve the lithographic performance of the imaging process. Conventional hard masks can be applied by chemical vapor deposition, such as sputtering. However, the relative simplicity of spin coating versus the aforementioned conventional approaches makes the development of a new spin-on hard mask or antireflective coating with high concentration of metallic materials in the film very desirable.

Underlayer compositions for semiconductor applications containing metal oxides have been shown to provide dry etch resistance as well as antireflective properties. Conventional soluble metal compounds to form metal oxide films, such as metal alkoxides, however, have been found to be very unstable to moisture in air thus creating a variety of issues, including shelf life stability, coating problems and performance shortcomings. Metal oxides have solubility problems in solvents typically used and accepted in the semiconductor industry.

For many decades Silicon dioxide ($SiO_2$) has been used as a gate oxide material. However, to increase device performance, as transistors have decreased in size, the thickness of the silicon dioxide gate dielectric thickness has steadily decreased in order to increase the gate capacitance and thereby drive current. Equation 1 illustrates this relationship between capacitance gate oxide where a MOSFET (metal-oxide-semiconductor field-effect transistor) is modeled as a simple parallel plate capacitor, ignoring quantum mechanical and depletion effects from the Si substrate and gate. In Equation 1, A is the capacitor area; K is the relative dielectric constant of the material (3.9 for silicon dioxide); co is the permittivity of free space and t is the thickness of the capacitor oxide insulator.

$$C = \frac{K\varepsilon_0 A}{t}$$ Equation 1

However, as the thickness scales much below 2 nm, leakage currents, due to quantum tunneling increases drastically. This leads to high power consumption and reduced device reliability. In order to increase gate capacitance without this leakage current, the silicon dioxide gate dielectric, needs to be replaced with a high-κ (high K) material (a.k.a. larger κ in Equation 1). Certain metal oxides are useful as high K metal oxides having K values of 10 or higher. However, these high K metal oxides are always deposited using CVD (chemical vapor deposition). CVD is a process that is expensive and which needs special equipment and does not have good planarization on the pattern substrate with deep via or trenches. Thus there is an outstanding need to prepare spin-on high K material that can be spun from solution which are stable after exposure to air. There is also a need for such air-stable-and thermally stable high K metal oxide formulations which can additionally act as good via and trench filling materials showing very low void formation. These needs are meet with the present inventive composition, which can fill a patterned substrate with a high K metal oxide precursor. Upon processing, these filled lithographic features, yield a substrate which has a patterned high K metal oxide, originating from the inventive composition. Apart from their use as high K materials, these novel compositions are useful as hard masks and in this capacity they may also be used to create a patterned hard mask on a semiconductor substrate (e.g. Silicon, Germanium and the like), allowing patterning of the substrate through a plasma etching process. These hard mask patterns may be created by patterning a coating of the novel composition on an unpatterned substrate through a conventional photoresist patterning approach. Alternatively this pattern may result from filling of topography already existing in either a semiconductor substrate or in an overlying patterned resist or patterned spin on carbon layer. In either hard mask application, after pattern transfer into the substrate is complete, any remaining hard mask pattern is the strippable in chemical solutions.

SUMMARY OF THE INVENTION

The present invention relates to a composition comprising; components a. c. and d. and optional component b. Wherein, component a. is a metal compound having the structure (I).

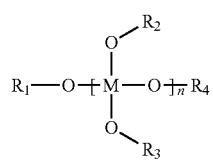

(I)

In Structure (I), M is a metal having a valence of four (4); n is an integer from 1 to 20 and each $R_1$, $R_2$, $R_3$, and $R_4$ is a moiety independently selected from the group consisting of 1), 2) and 3).

In Structure (I), moiety 1), is a first organic moiety having the structure (II). Wherein, in structure (II), $R_5$ is selected from the group consisting of $C_2$-$C_{10}$ alkylenes, $C_3$-$C_{12}$ branched alkylenes, $C_5$-$C_{12}$ cycloalkylenes, $C_2$-$C_{10}$ alkylenes containing a C=C double bond, $C_3$-$C_{12}$ branched alkylenes containing a C=C double bond, and $C_5$-$C_{12}$ cycloalkylenes containing a C=C double bond; and $R_6$ is hydrogen or an alkyloxycarbonyl having the structure (III). Wherein, in structure (III), $R_7$ is a $C_1$-$C_8$ alkyl.

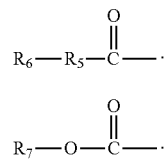

(II)

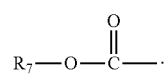

(III)

In Structure (I), moiety 2), is a silicon bearing organic moiety having at least 2 carbons and having the structure (IV). Wherein, in structure (IV), $R_8$ and $R_9$ are each independently selected from the group consisting of $C_1$-$C_8$ alkyls, $C_3$-$C_{12}$ branched alkyls, $C_1$-$C_8$ alkyloxys, $C_3$-$C_{12}$ branched alkyloxys, and $C_6$-$C_{16}$ aryls; $R_{10}$ is selected from the group consisting of $C_1$-$C_8$ alkyls, $C_6$-$C_{16}$ aryls, and hydroxyl and siloxanes having the structure (V). Wherein, in structure (V), R is selected from the group consisting of hydrogen, $C_1$-$C_8$ alkyls, $C_1$-$C_8$ alkyls substituted with a hydroxyl, $C_6$-$C_{16}$ aryls, an a silyl moieties having structure (IVa) and $R_{12}$ and $R_{13}$ are each independently selected from the group consisting of $C_1$-$C_8$ alkyls, $C_3$-$C_{12}$ branched alkyls and $C_6$-$C_{16}$ aryls; and p represents the number of repeat units in the siloxane moiety (V). Wherein, in structure (IVa), $R_{8a}$ and $R_{9a}$ are each independently selected from the group consisting of $C_1$-$C_8$ alkyls, $C_3$-$C_{12}$ branched alkyls, $C_1$-$C_8$ alkyloxys, $C_3$-$C_{12}$ branched alkyloxys, and $C_6$-$C_{16}$ aryls and $R_{10a}$ is selected from the group consisting of $C_1$-$C_8$ alkyls, and $C_6$-$C_{16}$ aryls.

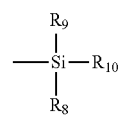

(IV)

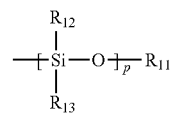

(V)

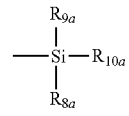

(IVa)

In Structure (I), moiety 3) is a second organic moiety selected from the group consisting of $C_2$-$C_5$ alkyls, $C_2$-$C_5$ alkyl carboxyls, $C_6$-$C_{20}$ aryl carboxyls, fluorenyl carboxyls, fluorinated $C_2$-$C_8$ alkyl carboxyls, $C_2$-$C_8$ alkyl sulfonyls, fluorinated $C_2$-$C_8$ alkyl sufonyls, and mixtures thereof.

In Structure (I), the moieties selected may be a mixtures thereof of the aforementioned moieties in this structure.

Optional Component b., in the aforementioned inventive compositions, is a polyol additive having the structure (VI)

wherein, X is C or N; r is at least 2; q is from 0 to 2; provided that the sum of q and r is 4 when X is C, and the sum of q and r is 3. When X is N; $R_{14}$ is selected from the group consisting of hydrogen, $C_1$-$C_8$ alkyls and $C_2$-$C_8$ hydroxyalkyls. When X is N, Y is a $C_1$-$C_8$ alkylene. When X is C, Y is selected from the group consisting of a direct valence bond, $C_1$-$C_8$ alkylenes and moieties having the structure (VII). Wherein, in Structure (VII), $R_{15}$ is a $C_2$-$C_8$ alkylene; s is 0 to 2; and t is 1 to 2

(VI)

(VII)

Component c., in the aforementioned inventive compositions, is a high performance polymer additive.

Component d., in the aforementioned inventive compositions, is a solvent.

The present invention also pertains to the process using the aforementioned inventive compositions, as precursors to high K metal oxides. The present invention further pertains to using the inventive composition to fill lithographic features on a substrate which, after processing, yield a substrate comprising a patterned high K metal oxide.

Specifically, it relates to using these novel air stable compositions to coat a patterned substrate which is a patterned photoresist, patterned spin on carbon, or patterned semiconductor comprising, Vias, trenches, holes or other hollow topographical features patterns filling these voids with low void formation, and using these filled patterns in a process to form a patterned metal oxide on the substrate.

DETAILED DESCRIPTION

It is to be understood that both the foregoing general description and the following detailed description are illustrative and explanatory, and are not restrictive of the subject matter, as claimed. In this application, the use of the singular includes the plural, the word "a" or "an" means "at least one", and the use of "or" means "and/or", unless specifically stated otherwise. Furthermore, the use of the term "including", as well as other forms such as "includes" and "included", is not limiting. Also, terms such as "element" or "component" encompass both elements and components comprising one unit and elements or components that comprise more than one unit, unless specifically stated otherwise. As used herein, the conjunction "and" is intended to be inclusive and the conjunction "or" is not intended to be exclusive unless otherwise indicated. For example, the phrase "or, alternatively" is intended to be exclusive. As used herein, the term "and/or" refers to any combination of the foregoing elements including using a single element.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature and similar materials defines a term in a manner that contradicts the definition of that term in this application, this application controls.

As used herein, the conjunction "and" is intended to be inclusive and the conjunction "or" is not intended to be exclusive unless otherwise indicated. For example, the phrase "or, alternatively" is intended to be exclusive.

As used herein, the term "and/or" refers to any combination of the foregoing elements including using a single element.

As used herein the term "M is a metal having a valence of four (4)," M and the term "metal," is inclusive of metalloids having a valence of four (4) such as Silicon, Germanium and the like unless otherwise indicated.

As used herein the term "alkyl" refers to straight, or cyclic chain alkyl substituents as well as any of their branched isomers. More specifically, herein, unless otherwise indicated, alkyl refers to hydrocarbon groups which can be linear, branched (e.g. methyl, ethyl, propyl, isopropyl, tert-butyl and the like) or cyclic (e.g. cyclohexyl, cyclopropyl, cyclopentyl and the like) multicyclic (e.g. norbornyl, adamantly and the like). These alkyl moieties may be substituted or unsubstituted as described below. The term alkyl refers to such moieties with $C_1$ to $C_{20}$ carbons. It is understood that for structural reasons linear alkyls start with C1, while branched alkyls and linear start with $C_3$ and multicyclic alkyls start with $C_5$. Moreover, it is further understood that moieties derived from alkyls described below such as substituted alkyls, have the same carbon number ranges unless otherwise indicated. If the length of the alkyl group is specified as other than described above, the above described definition of alkyl still stands with respect to it encompassing all types of alkyl moieties as described above and that the structural consideration with regards to minimum number of carbon for a given type of alkyl group still apply.

Alkyloxy (a.k.a. Alkoxy) refers to an alkyl group as defined above on which is attached through an oxy (—O—) moiety (e.g. methoxy, ethoxy, propoxy, butoxy, 1,2-isopropoxy, cyclopentyloxy cyclohexyloxy and the like). These alkyloxy moieties may be substituted or unsubstituted as described below.

Herein when referring to an alkyl, alkyloxy, moieties with a possible range carbon atoms which starts with $C_1$ such as for instance "$C_1$ to $C_{20}$ alkyl," or "$C_1$ to $C_{20}$ fluoroalkyl," as a non-limiting examples, this range encompasses linear alkyls, alkyloxy, fluoroalkyl and fluoroalkyloxy starting with $C_1$ but only designated branched alkyls, branched alkyloxy, cycloalkyl, cycloalkyloxy, branched fluoroalkyl, and cyclic fluoroalkyl starting with $C_3$.

Herein, the term "alkylene," refers to hydrocarbon groups which can be a linear, branched or cyclic which has two or more attachment points (e.g. of two attachment points: methylene, ethylene, 1,2-isopropylene, a 1,4-cyclohexylene and the like; of three attachment points 1,1,1-subsituted methane,1,1,2-subsituted ethane, 1,2,4-subsituted cyclohexane and the like). Here again, when designating a possible range of carbons, such as $C_1$ to $C_{20}$, as a non-limiting example, this range encompasses linear alkylenes starting with $C_1$ but only designates branched alkylenes, or cycloalkylene starting with $C_3$. These alkylene moieties may be substituted or unsubstituted as described below. More specifically, as used herein the term "linear alkylene" refers to straight chain di-functionalized alkylene substituents having the general formula —$CH_2$—$(CH_2)_n$—$CH_2$—, as used herein the term "branched alkylene" refers an alkylene substituent which either has alkyl substituents present.

As used herein the term "aryl" refers to any functional group or substituent derived from an aromatic ring, such as phenyl, naphthyl, thienyl, indolyl etc. More specifically, herein the term Aryl or aromatic groups refers to such groups which contain 6 to 24 carbon atoms including phenyl, tolyl, xylyl, naphthyl, anthracyl, biphenyls, bis-phenyls, tris-phenyls and the like. These aryl groups may further be substituted with any of the appropriate substituents e.g. alkyl, alkoxy, acyl or aryl groups mentioned hereinabove.

The term halide refers to a halo substituent selected from the group consisting of F, Cl, Br, and I.

Unless otherwise indicated in the text, the term "substituted" when referring to an aryl, alkyl, alkyloxy, refers to one of these moieties which also contain with one or more substituents, selected from the group consisting of unsubstituted alkyl, substituted alkyl, unsubstituted aryl, alkyloxyaryl (alkyl-O-aryl-), dialkyloxyaryl ((alkyl-O-)$_2$-aryl), haloaryl, alkyloxy, alkylaryl, haloalkyl, halide, hydroxyl, cyano, nitro, acetyl, alkylcarbonyl, The term "substituted," when designating a moiety, unless otherwise denoted, is when the substituent is selected from any of the above described substituents. Similarly, the term "unsubstituted" refers to these same moieties, wherein, no substituents apart from hydrogen is present.

As used herein the term "diketone" refers to any solvent having two ketone groups non limiting examples are diacetyl, acetylacetone, and hexane-2,5-dione.

As used herein the terms "composition" and "formulation" are used interchangeable and mean the same thing.

As used herein the terms. "spin on carbon layer," and "organic high carbon coating," are interchangeable and mean the same thing.

Herein, unless otherwise indicated, the term "patterned substrate," refers to the following: 1) A patterned semiconductor substrate; 2) a patterned photoresist overcoating a semiconductor, or a semiconductor coated with an underlayer such as antireflective coating; 3) a patterned organic high carbon coating on a semiconductor substrate, wherein the original high carbon material coating, may derived from a coated high carbon polymer film; a coated, spin on carbon material; or a film of high carbon content deposited on the semiconductor substrate by other means such as by a vapor deposition process and the like.

Herein, as used herein the term high k material, high k metal oxide, and high k comprised of a metal oxide, are interchangeable.

The present invention relates to a composition comprising; components a. c. and d, and optional component b. Wherein, component a. is a metal compound having the structure (I).

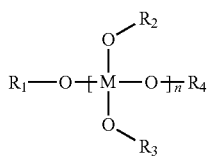

In Structure (I), M is a metal having a valence of four (4); n is an integer from 1 to 20 and each $R_1$, $R_2$, $R_3$, and $R_4$ is a moiety independently selected from the group consisting of 1), 2) and 3).

In Structure (I), moiety 1), is a first organic moiety having the structure (II). Wherein, in structure (II), $R_5$ is selected from the group consisting of $C_2$-$C_{10}$ alkylenes, $C_3$-$C_{12}$ branched alkylenes, $C_5$-$C_{12}$ cycloalkylenes, $C_2$-$C_{10}$ alkylenes containing a C=C double bond, $C_3$-$C_{12}$ branched alkylenes containing a C=C double bond, and $C_5$-$C_{12}$ cycloalkylenes containing a C=C double bond; and $R_6$ is hydrogen or an alkyloxycarbonyl having the structure (III), wherein, in structure (III), $R_7$ is a $C_1$-$C_8$ alkyl.

In Structure (I), moiety 2), is a silicon bearing organic moiety having at least 2 carbons and having the structure (IV). Wherein, in structure (IV), $R_8$ and $R_9$ are each independently selected from the group consisting of $C_1$—C alkyls, $C_3$-$C_{12}$ branched alkyls, $C_1$-$C_8$ alkyloxys, $C_3$-$C_{12}$ branched alkyloxys, and $C_6$-$C_{16}$ aryls; $R_{10}$ is selected from the group consisting of $C_1$-$C_8$ alkyls, $C_6$-$C_{16}$ aryls, and hydroxyl and siloxanes having the structure (V). Wherein, in structure (V), R is selected from the group consisting of hydrogen, $C_1$-$C_8$ alkyls, $C_1$-$C_8$ alkyls substituted with a hydroxyl, $C_6$-$C_{16}$ aryls, an a silyl moieties having structure (IVa) and $R_{12}$ and $R_{13}$ are each independently selected from the group consisting of $C_1$-$C_8$ alkyls, $C_3$-$C_{12}$ branched alkyls and $C_6$-$C_{16}$ aryls; and p represents the number of repeat units in the siloxane moiety (V). In structure (IVa), $R_{8a}$ and $R_{9a}$ are each independently selected from the group consisting of $C_1$-$C_8$ alkyls, $C_3$-$C_{12}$ branched alkyls, $C_1$-$C_8$ alkyloxys, $C_3$-$C_{12}$ branched alkyloxys, and $C_6$-$C_{16}$ aryls and $R_{10a}$ is selected from the group consisting of $C_1$-$C_8$ alkyls, and $C_6$-$C_{16}$ aryls.

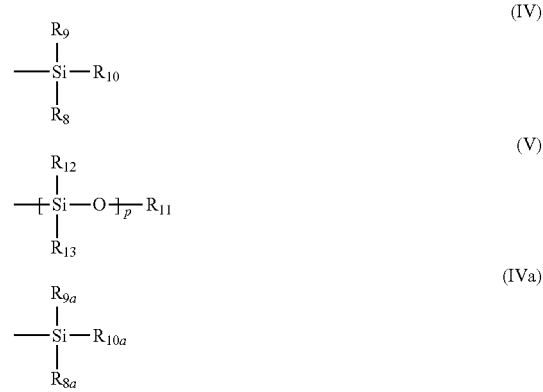

In Structure (I), moiety 3) is a second organic moiety selected from the group consisting of $C_2$-$C_8$ alkyls, $C_2$-$C_8$ alkyl carboxyls, $C_6$-$C_{20}$ aryl carboxyls, fluorenyl carboxyls, fluorinated $C_2$-$C_8$ alkyl carboxyls, $C_2$-$C_8$ alkyl sulfonyls, fluorinated $C_2$-$C_8$ alkyl sufonyls, and mixtures thereof.

In Structure (I), the moieties selected may be a mixtures thereof of the aforementioned moieties in this structure.

Optional Component b., in the aforementioned inventive compositions, is a polyol additive having the structure (VI) wherein, X is C or N; r is at least 2; q is from 0 to 2; provided that the sum of q and r is 4 when X is C, and the sum of q and r is 3. When X is N; $R_{14}$ is selected from the group consisting of hydrogen, $C_1$-$C_8$ alkyls and $C_2$-$C_8$ hydroxyalkyls. When X is N, Y is a $C_1$-$C_8$ alkylene. When X is C, Y is selected from the group consisting of a direct valence bond, $C_1$-$C_8$ alkylenes and moieties having the structure (VII). In Structure (VII), $R_{15}$ is a $C_2$-$C_8$ alkylene; s is 0 to 2; and t is 1 to 2.

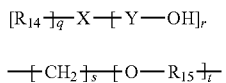

(VI)

$$-\!\!-\!\!(\mathrm{CH}_2)_{\overline{s}}\!\!-\!\!(\mathrm{O}-\mathrm{R}_{15})_{\overline{t}}\!\!-\!\!-$$

(VII)

Component c., in the aforementioned inventive compositions, is a high performance polymer additive.

Component d., in the aforementioned inventive compositions, is a solvent.

Compositions

Component a., the Metal Compound

In one embodiment of the aforementioned inventive compositions, in structure (I), M is selected from the group consisting of Si, Zr, Ta, Hf, Ti, Sn, Si, Pb, Nb, Mo, Ge and W. In another embodiment of this aspect of the inventive compositions, M is selected from the group consisting of Zr, Hf, Ti, Ta, Nb and Sn. In yet another embodiment M is selected from Zr, Hf and Ti. In still another embodiment M is Zr. In still another embodiment M is Hf. In yet another embodiment, M is Ti.

In another embodiment, component a, is a mixture of two or more different metal compounds having structure (I).

In another embodiment, component a, is a mixture of two or more different metal compounds having structure (I), having different M's.

In another embodiment, component a, is a mixture of two or more different metal compounds having structure (I), wherein, M is selected from the group consisting of Si, Zr, Ta, Hf, Ti, Sn, Si, Pb, Nb, Mo, Ge and W, and further wherein, at least one metal compound in the mixture does not have M equal to Si.

In another embodiment, component a, is a mixture of two different metal compounds having structure (I), wherein, the first metal compound's M is Si and the second metal compound has M selected from the group consisting of Zr, Ta, Hf, Ti, Sn, Si, Pb, Nb, Mo, Ge and W. In another aspect of this embodiment, the second metal compound has M equal to Zr. In another aspect of this embodiment, the second metal compound has M equal to Hf. In still another aspect of this embodiment, the second metal compound has M equal to Ti.

In another embodiment of the aforementioned inventive compositions, in Structure (I), at least one of the moieties for $R_1$, $R_2$, $R_3$ and $R_4$ is selected from the group consisting of: said first organic moiety having the structure (II), and said silicon bearing organic moiety having at least 2 carbons and having the structure (IV).

In another embodiment of the aforementioned inventive compositions, in Structure (I) at least one of the moieties for $R_1$, $R_2$, $R_3$ and $R_4$ is selected from the group consisting of:

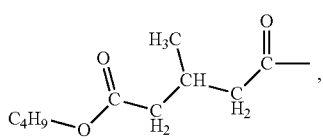

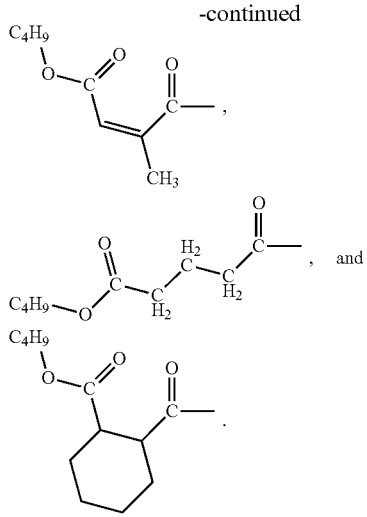

In another embodiment of the aforementioned inventive compositions, in Structure (I), each $R_1$, $R_2$, $R_3$ and $R_4$ is independently selected from the group consisting of a first organic moiety having the structure (II) and a silicon bearing organic moiety having at least 2 carbons and having the structure (IV).

In another embodiment of the aforementioned inventive compositions, in Structure (I), the silicon bearing organic moiety having at least 2 carbons and having the structure (IV) is present in a range from 30 mole % to 60 mole % of the total moles of $R_1$, $R_2$, $R_3$ and $R_4$ of the metal compound having the structure (I).

In another embodiment of the aforementioned inventive compositions, in Structure (I), wherein, n is 2-20.

In another embodiment of the aforementioned inventive compositions, in Structure (I), wherein, n is 1.

In another embodiment of the aforementioned inventive compositions, the first organic moiety having the structure (II), is one wherein, $R_5$ is a $C_2$-$C_{10}$ alkylenes, a $C_2$-$C_{10}$ alkylenes containing a C=C double bond, or a $C_5$-$C_{12}$ cycloalkylene. In another aspect of this embodiment, $R_5$ is a $C_2$—C alkylene. In another aspect of this embodiment, $R_5$ is a $C_2$-$C_{10}$ alkylene containing a C=C double bond. In yet another aspect, $R_5$ is a $C_5$-$C_{12}$ cycloalkylene.

In another embodiment of the aforementioned inventive compositions, the first organic moiety having the structure (II), is one wherein, $R_6$ is a $C_1$—C alkyloxycarbonyl. In another aspect of this embodiment, $R_6$ is a $C_2$-$C_6$ alkyloxycarbonyl. In yet another embodiment $R_6$ is a $C_3$-$C_4$ alkyloxycarbonyl.

In another embodiment of the aforementioned inventive compositions, the first organic moiety having the structure (II), $R_6$ has structure (III) wherein, $R_7$ is a $C_1$-$C_5$ alkyl. In another aspect of this embodiment, $R_7$ is a $C_2$-$C_6$ alky. In yet another embodiment, $R_7$ is $C_3$-$C_4$ alkyl.

In another embodiment of the aforementioned inventive compositions, structure (IV), this embodiment is one wherein, $R_8$ is methyl, ethyl, propyl, butyl or t-butyl.

In another embodiment of the aforementioned inventive compositions, structure (IV), this embodiment is one wherein, $R_9$ is methyl, ethyl, propyl, butyl or t-butyl.

In another embodiment of the aforementioned inventive compositions, structure (IV), this embodiment is one wherein, $R_8$ is selected from the group consisting of $C_1$-$C_8$ alkyloxys, $C_3$-$C_{12}$ branched alkyloxys, and $C_6$-$C_{16}$ aryls.

In another embodiment of the aforementioned inventive compositions, structure (IV), this embodiment is one wherein, $R_9$ is selected from the group consisting of $C_1$-$C_8$ alkyloxys, $C_3$-$C_{12}$ branched alkyloxys, and $C_6$-$C_{16}$ aryls.

In another embodiment of the aforementioned inventive compositions, in structure (IV), this embodiment is one wherein, $R_{10}$ is a $C_1$-$C_8$ alkyls, a $C_6$-$C_{16}$ aryls, or a hydroxyl.

In another embodiment of the aforementioned inventive compositions, in structure (IV), this embodiment is one wherein, $R_{10}$ is a $C_1$-$C_8$ alkyls, or a $C_6$-$C_{16}$ aryls.

In another embodiment of the aforementioned inventive compositions, in structure (IV), this embodiment is one wherein, $R_{10}$ is a $C_1$-$C_8$ alkyls.

In another embodiment of the aforementioned inventive compositions, in structure (IV), this embodiment is one wherein, $R_{10}$ is a siloxanes having the structure (V).

In another embodiment of the aforementioned inventive compositions, structure (IV), this embodiment is one wherein, $R_5$ and $R_9$ are independently selected from the group consisting of $C_1$-$C_8$ alkyloxys, $C_3$-$C_{12}$ branched alkyloxys, and $C_6$-$C_{16}$ aryls; $R_{10}$ is a siloxanes having the structure (V), wherein, $R_1$ is a silyl moiety having structure (IVa) wherein, $R_{5a}$ and $R_{9a}$ are each independently selected from a $C_1$-$C_8$ alkyloxys, $C_3$-$C_{12}$ branched alkyloxys, and $R_{10a}$ is a $C_6$-$C_{16}$ aryls.

In another embodiment of the aforementioned inventive compositions, this embodiment is one wherein, in structure (IV), $R_8$ and $R_9$ are independently selected from the group consisting of $C_1$-$C_8$ alkyloxys, $C_3$-$C_{12}$ branched alkyloxys, and $C_6$-$C_{16}$ aryls; and wherein, $C_{10}$ is selected from the group consisting of $C_1$-$C_8$ alkyls, $C_3$-$C_{12}$ branched alkyls, $C_1$-$C_8$ alkyloxys, $C_3$-$C_{12}$ branched alkyloxys, and $C_6$-$C_{16}$ aryls.

In another embodiment of the aforementioned inventive compositions, in structure (IV), $R_{10}$ is methyl, ethyl, propyl, butyl or t-butyl.

In another embodiment of the aforementioned inventive compositions, in structure (IV), $R_{10}$ is a siloxane having the structure (V).

In another embodiment of the aforementioned inventive compositions, in structure (IV), in structure (V), $R_1$ is a $C_1$-$C_8$ alkyl or hydrogen. In another aspect of this embodiment, $R_{11}$ is a $C_1$-$C_4$ alkyls or hydrogen. In yet another embodiment, $R_1$ is a $C_1$-$C_8$ alkyls. In still another embodiment, $R_1$ is a $C_1$-$C_4$ alkyls. In yet another embodiment, R is hydrogen.

In another embodiment of the aforementioned inventive compositions, in structure (IV), in structure (V) $R_{12}$ is a $C_1$-$C_8$ alkyls. In another aspect of this embodiment, $R_{12}$ is a $C_1$-$C_6$ alkyls. In yet another embodiment $R_{12}$ is a $C_1$-$C_4$ alkyls.

In another embodiment of the aforementioned inventive compositions, in structure (IV), $R_{13}$ is a $C_1$-$C_8$ alkyls. In another aspect of this embodiment, $R_1$ is a $C_1$-$C_6$ alkyls. In yet another embodiment, $R_{13}$ is a $C_1$-$C_4$ alkyls.

In another embodiment of the aforementioned inventive compositions, in structure (IV), p is 1-500. In another aspect of this embodiment p is 1-200. In yet another embodiment, p is 1-50.

In another embodiment of the aforementioned inventive compositions, it comprises metal compounds having the following structures or mixtures of compounds having these structures each of which contains a repeat unit designated by n (the number of repeat units), and two end groups: Wherein, the structures are structure (Ia1), structure (Ia2), structure (Ia3), or structure (Ia4), wherein, $R_{6a}$, $R_{6b}$ and $R_{6c}$ are independently selected from a $C_1$-$C_4$ alkyls, and further wherein, n independently is an integer from 1 to 20. In another embodiment of this aspect of the invention n is 6-20.

In another embodiment of this aspect of the invention n is 1. In yet another embodiment, when n is 2-20, the metal compound comprises mixture of repeat unit designated by n, and the two end groups found in the aforementioned structures. In another preferred embodiment of this aspect of the invention n is 6-10.

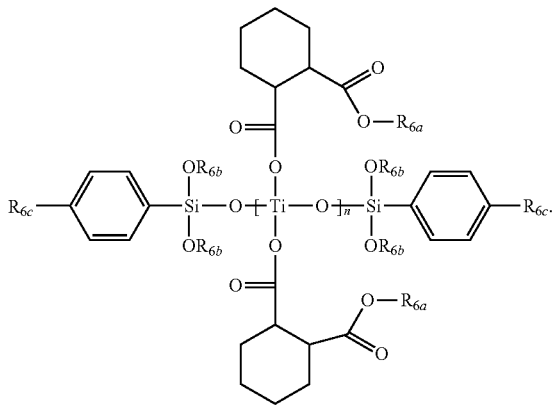

(Ia1)

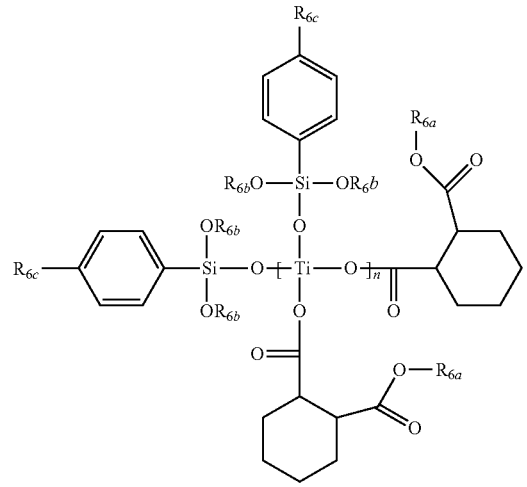

(Ia2)

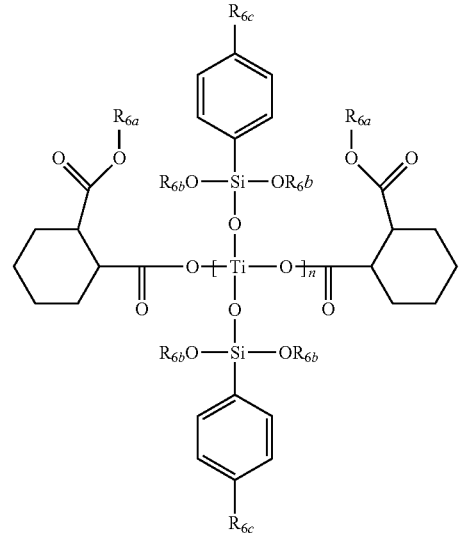

(Ia3)

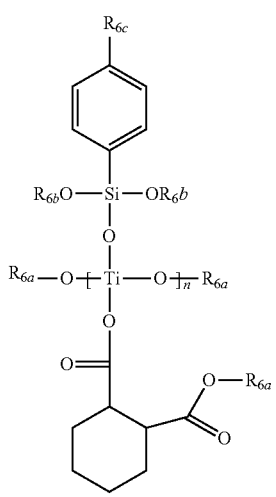
(Ia4)

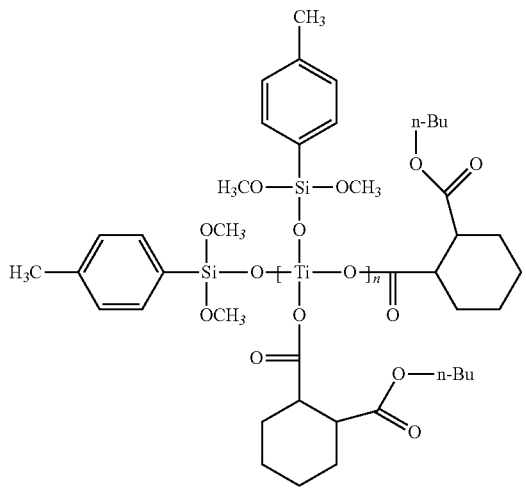
(Ib2)

In another embodiment of the aforementioned inventive compositions, it comprises metal compounds having the following structures or mixtures of these each of which contains a repeat unit designated by n (the number of repeat units), and two end groups: Wherein, the structures are (Ib1), structure (Ib2), structure (Ib3), or structure (Ib4), and further wherein, n, independently is an integer from 1 to 20. In another embodiment of this aspect of the invention n is 6-20. In another embodiment of this aspect of the invention n is 1. In yet another embodiment, when n is 2-20, the metal compound comprises mixture of repeat unit designated by n, and the two end groups found in the aforementioned structures. In another preferred embodiment of this aspect of the invention n is 6-10.

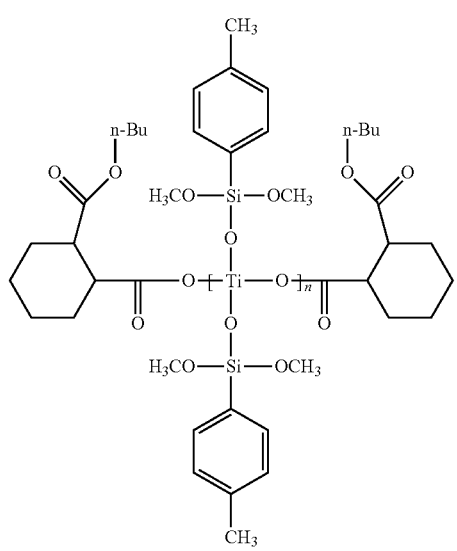
(Ib3)

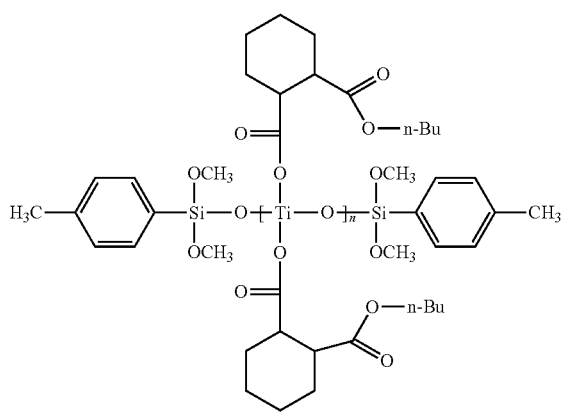
(Ib1)

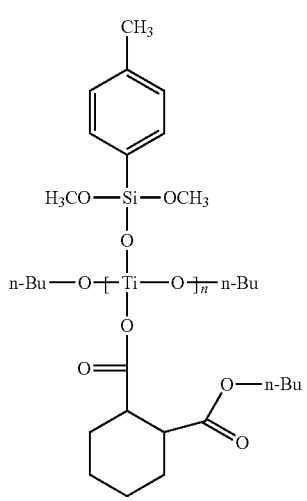
(Ib4)

In another embodiment of the aforementioned inventive compositions, it comprises metal compounds having the following structures or mixtures of compounds having these structures each of which contains a repeat unit designated by n, (the number of repeat units), and two end groups: Wherein, the structures are structure (Ic1), structure (Ic2), structure (Ic3), structure (Ic4), structure (Ic5), or structure (Ic6), wherein, $R_{11b}$ is selected from the group consisting of hydrogen, $C_1$-$C_8$ alkyls, $C_1$-$C_8$ alkyls substituted with a hydroxyl, a $C_6$-$C_{16}$ aryl, and a silyl moiety having structure (IVb), and $R_{6a}$, $R_{6b}$ and $R_{6c}$ are independently selected from a $C_1$-$C_4$ alkyls, wherein, n, independently is an integer from 1 to 20 and p is independently an integer from 1 to 500. In another embodiment of this aspect of this invention n is from 1 to 20. In another embodiment of this aspect of the invention n is 6-20. In another embodiment of this aspect of the invention n is 1. In yet another embodiment, when n is 2-20, the metal compound comprises mixture of repeat unit designated by n, and the two end groups found in the aforementioned structures.

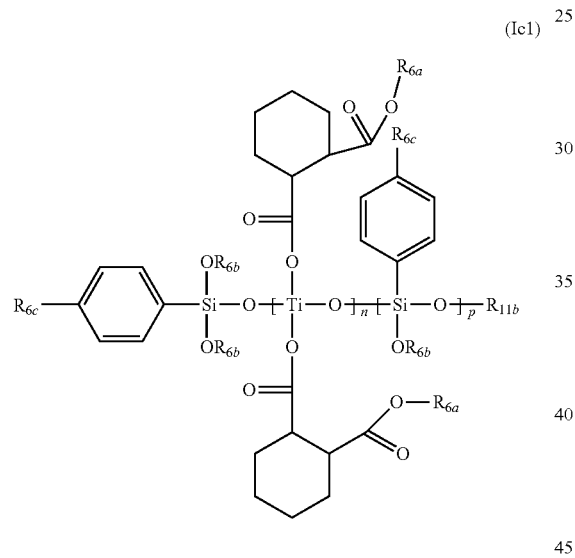

(Ic1)

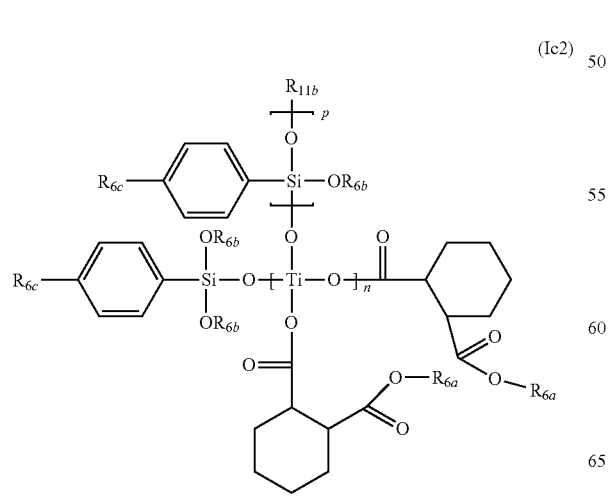

(Ic2)

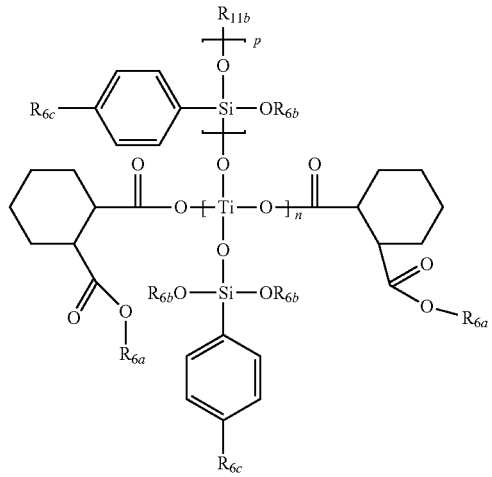

(Ic3)

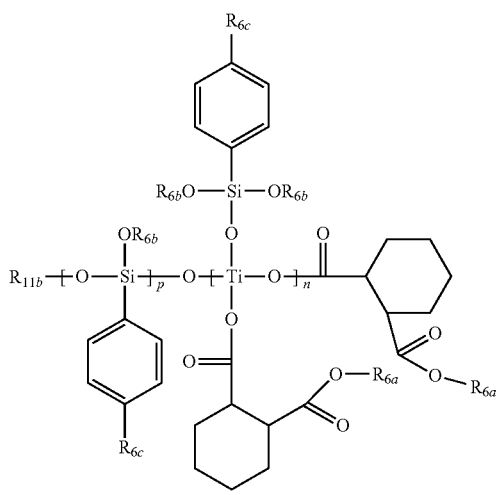

(Ic4)

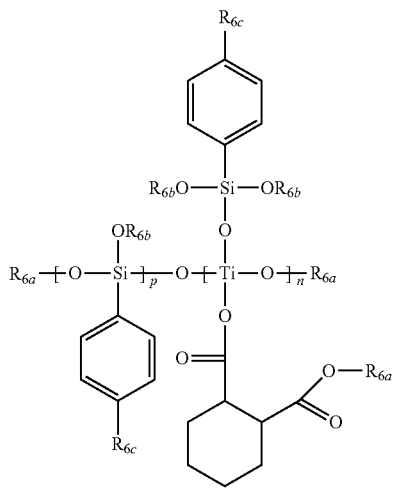

(Ic5)

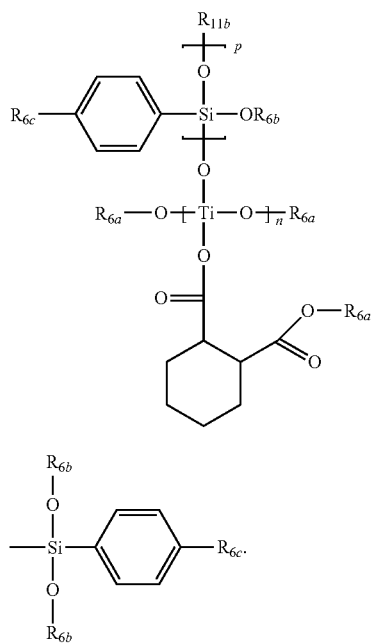

In another embodiment of the aforementioned inventive compositions, it comprises metal compounds having the following structures or mixtures of compounds having these structures each of which contains a repeat unit designated by n (the number of repeat units), and two end groups: Wherein, the structures are structure (Id1), structure (Id2), structure (Id3), structure (Id4), structure (Id5), or structure (Id6), wherein, $R_{11a}$ is a silyl moiety having structure (IVc), wherein, n independently is an integer from 1 to 20, and p independently is an integer from 1 to 500. In another embodiment of this aspect of the invention n is 6-20. In another embodiment of this aspect of the invention n is 1. In yet another embodiment, when n is 2-20, the metal compound comprises mixture of repeat unit designated by n, and the two end groups found in the aforementioned structures.

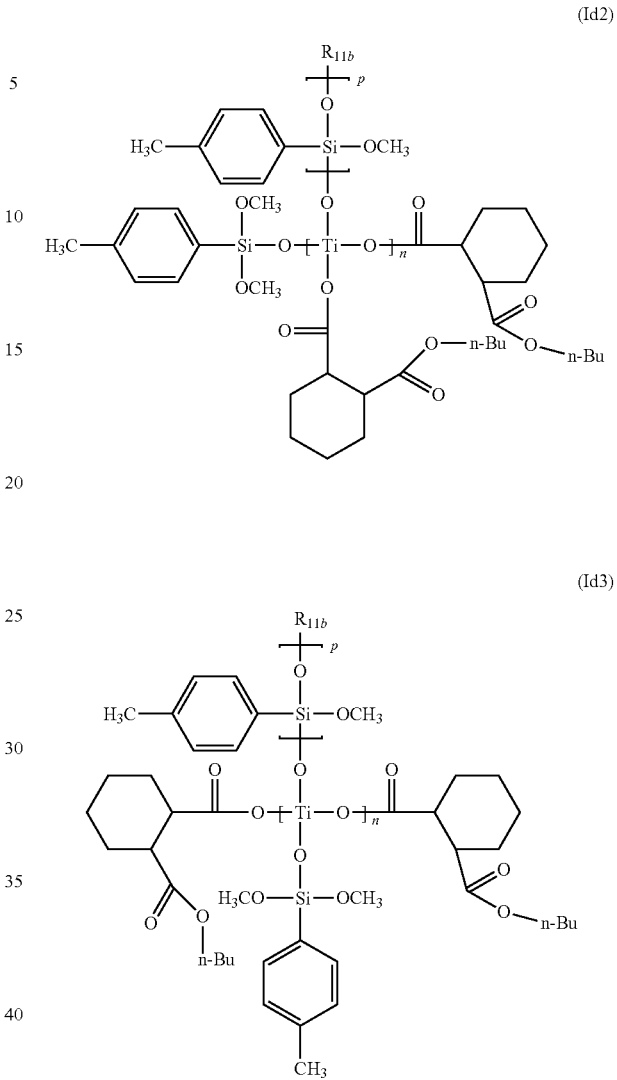

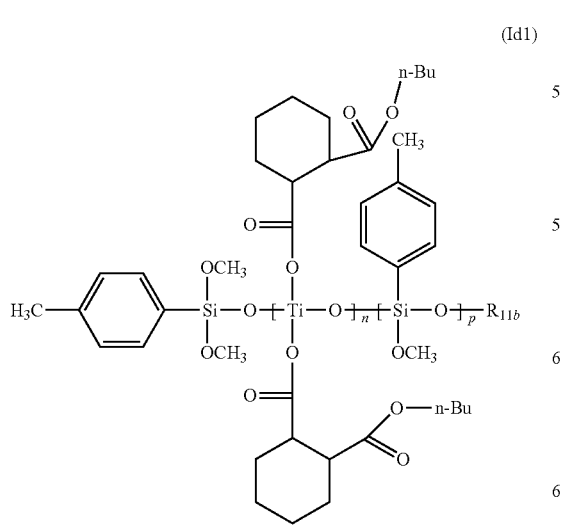

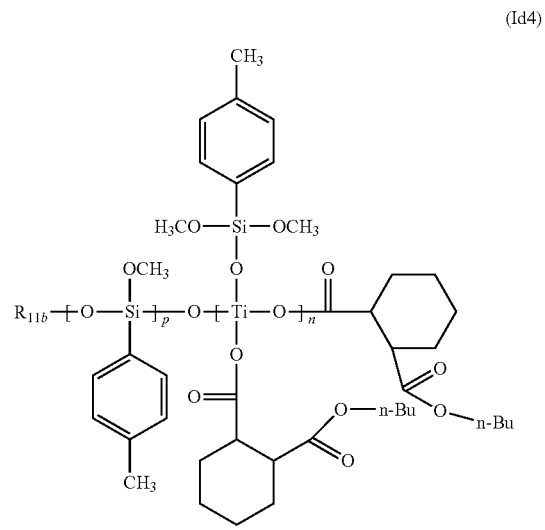

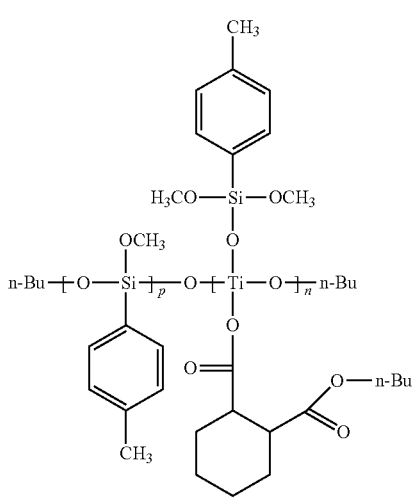
(Id5)

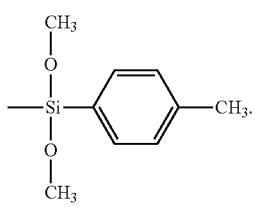
(Id6)

(IVc)

In another embodiment of the aforementioned inventive compositions, it comprises metal compounds having the following structures or mixtures of compounds having these structures each of which contains a repeat unit designated by n (the number of repeat units), and two end groups: Wherein, the structures are structure (e), structure (Ie2), structure (Ie3), or structure (Ie4), wherein, $R_{6a}$ is selected from a $C_1$-$C_4$ alkyls, and $R_{8a}$ and $R_{9a}$ are each independently selected from the group consisting of $C_1$-$C_8$ alkyls, $C_3$-$C_{12}$ branched alkyls, $C_1$-$C_5$ alkyloxys, $C_3$-$C_{12}$ branched alkyloxys, and $C_6$-$C_{16}$ aryls, and $R_{10a}$ is selected from the group consisting of $C_1$-$C_8$ alkyls, and $C_6$-$C_{16}$ aryls, wherein, n, independently is an integer from 1 to 20. In another embodiment of this aspect of the invention n is 6-20. In another embodiment of this aspect of the invention n is 1. In yet another embodiment, when n is 2-20, the metal compound comprises mixture of repeat unit designated by n, and the two end groups found in the aforementioned structures.

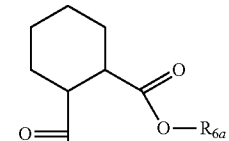
(Ie1)

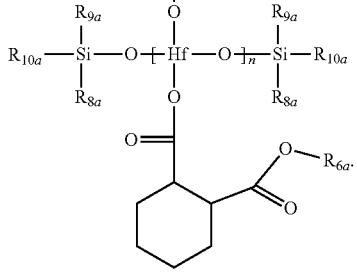
(Ie2)

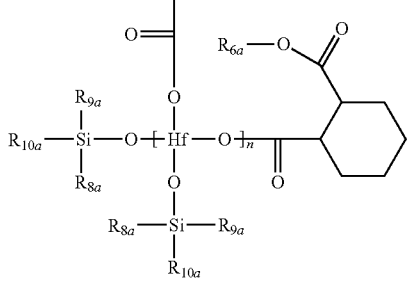
(Ie3)

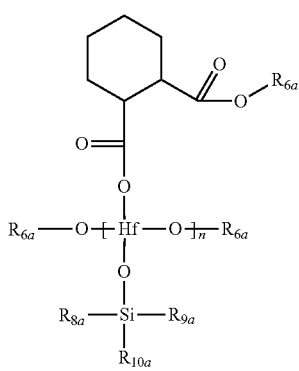
(Ie4)

In another embodiment of the aforementioned inventive compositions, it comprises metal compounds having the following structures or mixtures of compounds having these structures each of which contains a repeat unit designated by n (the number of repeat units), and two end groups: Wherein, the structures are structure (If1), structure (I2), or structure (I), wherein, $R_{6a}$ is selected from a $C_1$-$C_4$ alkyls, and $R_{8a}$ and $R_{9a}$ are each independently selected from the group consisting of $C_1$-$C_8$ alkyls, $C_3$-$C_{12}$ branched alkyls, $C_1$-$C_8$ alkyloxys, $C_3$-$C_{12}$ branched alkyloxys, and $C_6$-$C_{16}$ aryls, and $R_{10a}$ is selected from the group consisting of $C_1$-$C_8$ alkyls, and $C_6$-$C_{16}$ aryls, wherein, n is 1 to 20. In another embodiment of this aspect of the invention n is 6-20. In another embodiment of this aspect of the invention n is 1. In yet another embodiment, when n is 2-20, the metal compound comprises mixture of repeat unit designated by n, and the two end groups found in the aforementioned structures.

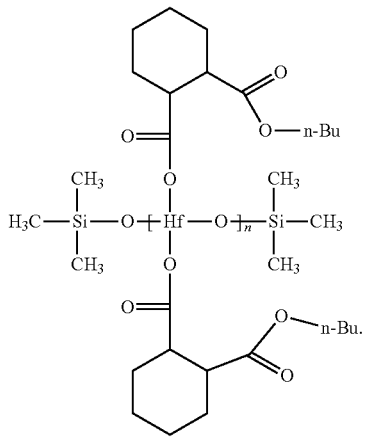

(If1)

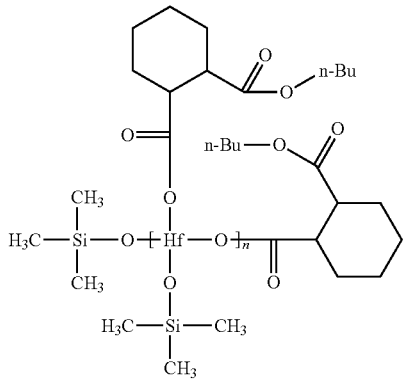

(If2)

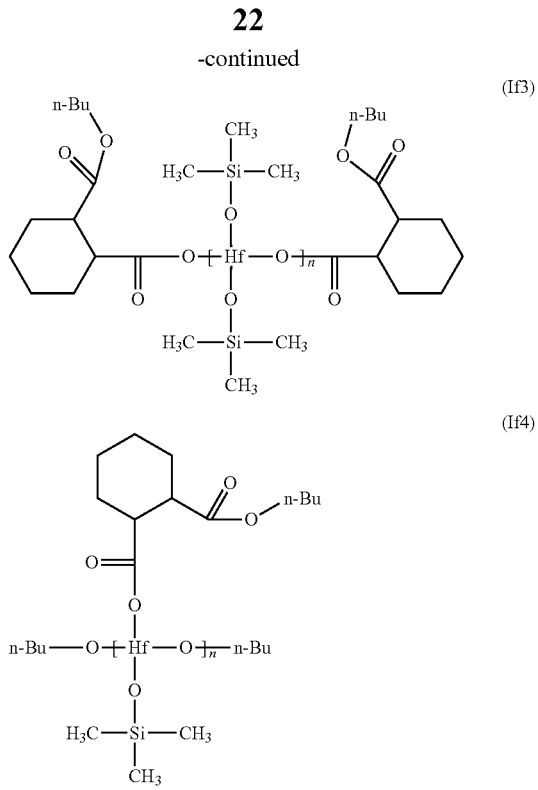

(If3)

(If4)

In another embodiment of the aforementioned inventive compositions, it comprises metal compounds having the following structures or mixtures of compounds having these structures each of which contains a repeat unit designated by n (the number of repeat units), and two end groups: Wherein, the structures are structure (Ig1), structure (Ig2), structure (Ig3), or structure (Ig4), wherein, $R_{6a}$ is selected from a $C_1$-$C_4$ alkyls, and $R_{8a}$ and $R_{9a}$ are each independently selected from the group consisting of $C_1$—C alkyls, $C_3$-$C_{12}$ branched alkyls, $C_1$-$C_8$ alkyloxys, $C_3$-$C_{12}$ branched alkyloxys, and $C_6$-$C_{16}$ aryls, and $R_{10a}$ is selected from the group consisting of $C_1$-$C_8$ alkyls, and $C_6$-$C_{16}$ aryls, wherein, n is 1 to 20. In another embodiment of this aspect of the invention n is 6-20. In another embodiment of this aspect of the invention n is 1. In yet another embodiment, when n is 2-20, the metal compound comprises mixture of repeat unit designated by n, and the two end groups found in the aforementioned structures.

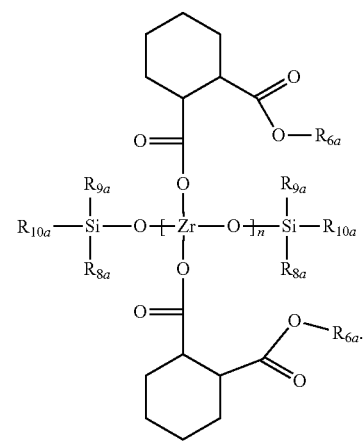

(Ig1)

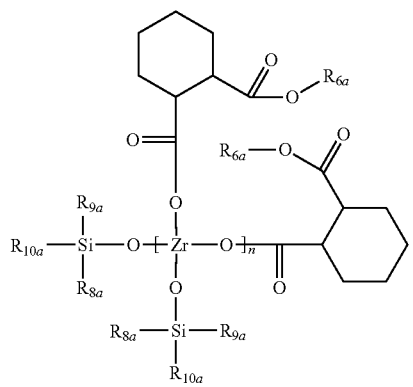

(Ig2)

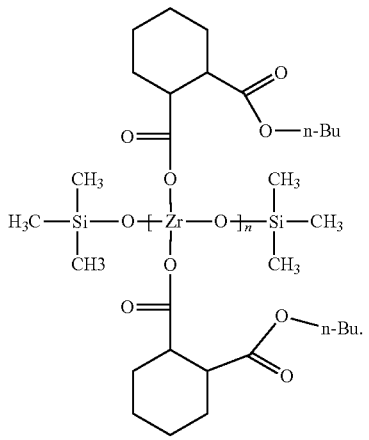

(Ih1)

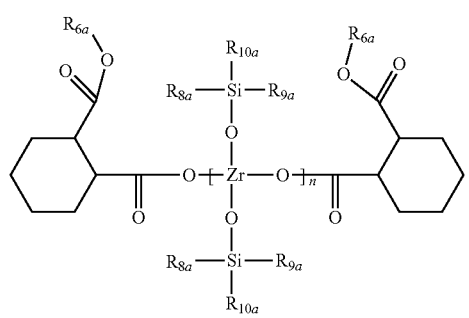

(Ig3)

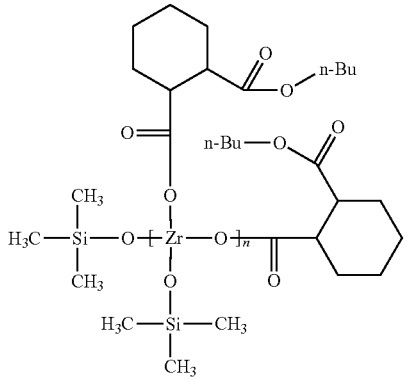

(Ih2)

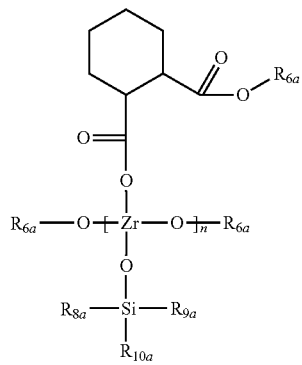

(Ig4)

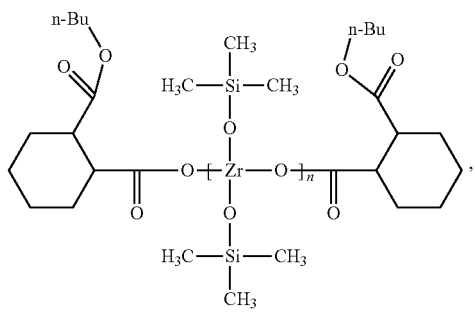

(Ih3)

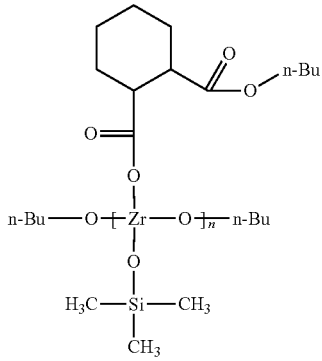

(Ih4)

In another embodiment of the aforementioned inventive compositions, it comprises metal compounds having the following structures or mixtures of compounds having these structures each of which contains a repeat unit designated by n (the number of repeat units), and two end groups: Wherein, the structures are structure (Ih1), structure (Ih2), structure (Ih4), or structure (Ih3), wherein, n is 1 to 20. In another embodiment of this aspect of the invention n is 6-20. In another embodiment of this aspect of the invention n is 1. In yet another embodiment, when n is 2-20, the metal compound comprises mixture of repeat unit designated by n, and the two end groups found in the aforementioned structures.

In another embodiment of the aforementioned inventive compositions, it comprises metal compounds having the following structures or mixtures of compounds having these structures each of which contains a repeat unit designated by n (the number of repeat units), and two end groups: Wherein, the structures are structure (Ii1), structure (Ii2), structure (Ii3), or structure (Ii4), wherein, $R_{6a}$ and $R_{6d}$ are independently selected from a $C_1$-$C_4$ alkyls, and $R_{8a}$ and $R_{9a}$ are each independently selected from the group consisting of $C_1$-$C_8$ alkyls, $C_3$-$C_{12}$ branched alkyls, $C_1$-$C_8$ alkyloxys, $C_3$-$C_{12}$ branched alkyloxys, and $C_6$-$C_{16}$ aryls, and $R_{10a}$ is selected from the group consisting of $C_1$-$C_8$ alkyls, and $C_6$-$C_{16}$ aryls, and further wherein, n is 1 to 20. In another embodiment of this aspect of the invention n is 6-20. In another embodiment of this aspect of the invention n is 1. In yet another embodiment, when n is 2-20, the metal compound comprises mixture of repeat unit designated by n, and the two end groups found in the aforementioned structures.

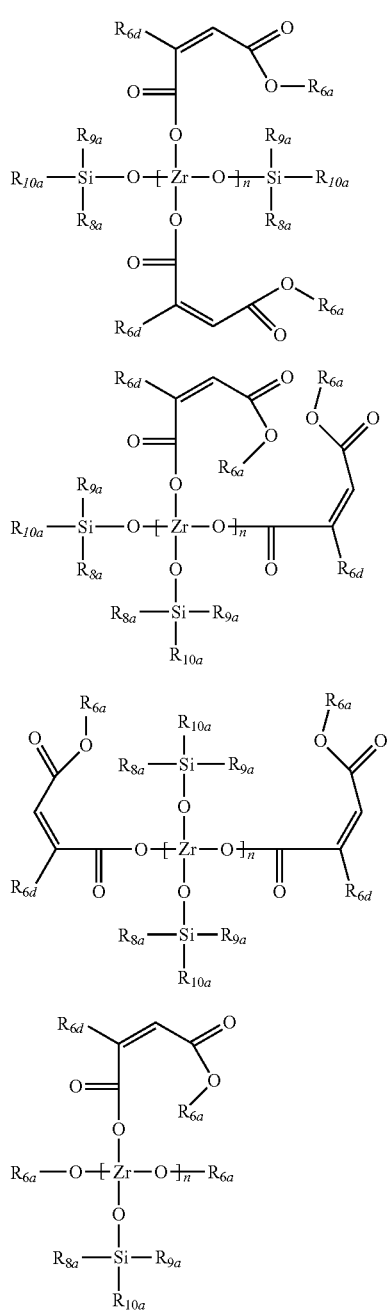

In another embodiment of the aforementioned inventive compositions, it comprises metal compounds having the following structures or mixtures of compounds having these structures each of which contains a repeat unit designated by n (the number of repeat units), and two end groups: Wherein, the structures are structure (Ij1), structure (Ij2), structure (Ij3), or structure (Ij4), wherein, n is 1 to 20. In another embodiment of this aspect of the invention n is 6-20. In another embodiment of this aspect of the invention n is 1. In yet another embodiment, when n is 2-20, the metal compound comprises mixture of repeat unit designated by n, and the two end groups found in the aforementioned structures.

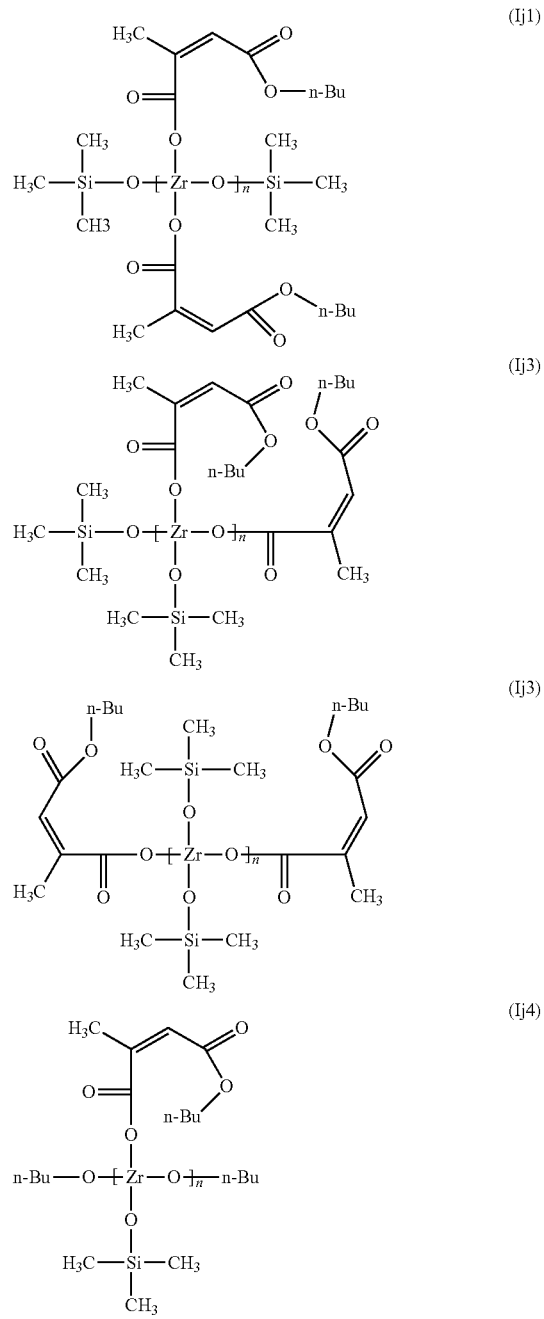

In another embodiment of the aforementioned inventive compositions, it comprises metal compounds having the following structures or mixtures of compounds having these structures each of which contains a repeat unit designated by n (the number of repeat units), and two end groups: Wherein, the structures are structure (Ik1), structure (Ik2), structure (Ik3), or structure (Ik4), wherein, $R_{6a}$ is selected from a $C_1$-$C_4$ alkyls, and $R_{8a}$ and $R_{9a}$ are each independently selected from the group consisting of $C_1$—C alkyls, $C_3$-$C_{12}$ branched alkyls, $C_1$—C alkyloxys, $C_3$-$C_{12}$ branched alkyloxys, and $C_6$-$C_{16}$ aryls, and $R_{10a}$ is a $C_1$-$C_8$ alkyls, wherein, n is 6-20. In yet another embodiment, when n is 6-20, the metal compound comprises mixture of repeat unit designated by n, and the two end groups found in the aforementioned structures.

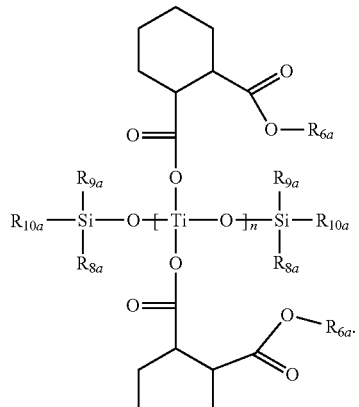
(Ik1)

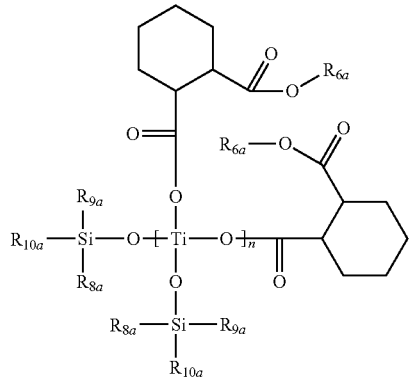
(Ik2)

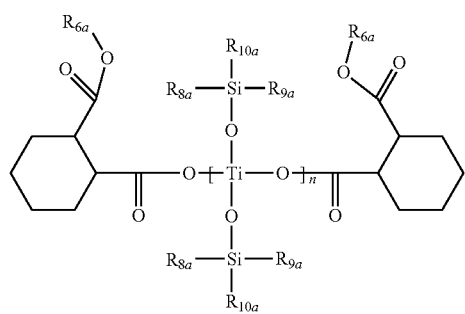
(Ik3)

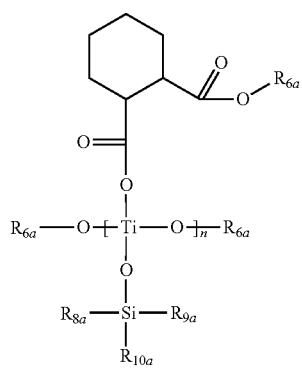
(Ik4)

In another embodiment of the aforementioned inventive compositions, it comprises metal compounds having the following structures or mixtures of compounds having these structures each of which contains a repeat unit designated by n (the number of repeat units), and two end groups: Wherein, the structures are structure (I1), structure (I12), structure (I13), or structure (I13), wherein, n is 6-20. In yet another embodiment, when n is 6-20, the metal compound comprises mixture of repeat unit designated by n, and the two end groups found in the aforementioned structures.

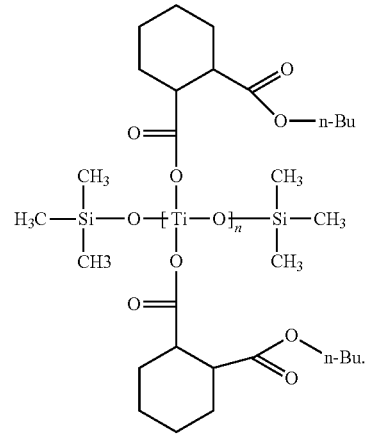
(I11)

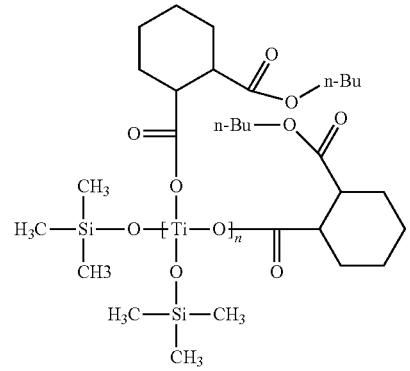
(I12)

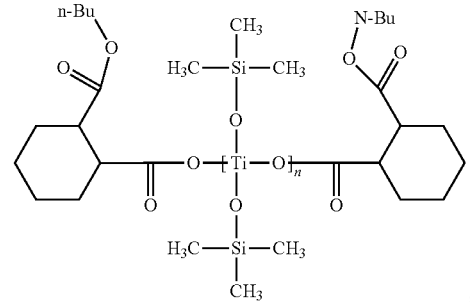
(I13)

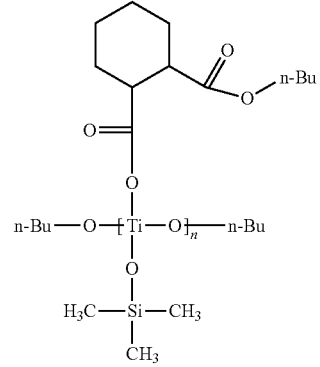
(I14)

In another embodiment of the aforementioned inventive composition, the wt. % of component a., the metal compound, as the total wt. % of all solid components, when component b, the polyol, is present, is from about 20 wt. % to about 98 wt. %. In another aspect of this embodiment the wt. % total solid component is from about 25 wt. % to about 80 wt. %. In another aspect of this embodiment the wt. % total solid component is from about 30 wt. % to about 70 wt. %. In another aspect of this embodiment the wt. % total solid component is from about 35 wt. % to about 65 wt. %. In another aspect of this embodiment the wt. % total solid component is from about 40 wt. % to about 60 wt. %. In another aspect of this embodiment the wt. % total solid component is from about 45 wt. % to about 60 wt. %. In another aspect of this embodiment the wt. % total solid component is from about 50 wt. % to about 60 wt. %. In another aspect of this embodiment the wt. % total solid component is from about 55 wt. % to about 60 wt. %

In another preferred embodiment of the aforementioned inventive composition, when component b., the polyol, is present, the wt. % of component a., the metal compound, is present from about 20 wt. % to about 85 wt. %. In another aspect of this embodiment the wt. % total solid component a. is from about 30 wt. % to about 80 wt. %. In another aspect of this embodiment the wt. % total solid component a. is from about 50 wt. % to about 75 wt. %.

In all the above described embodiment where component b., the polyol, is present the total combined solid content, adds up to 100 wt. %, if no additional solid components are present. If an additional solid component is present the total wt. % solid of all solids component a., component b., component c and any additional component(s) adds up to 100 wt. % of total solids, if no additional solid components are present. If an additional solid component is present the total wt. % solid of all solids, component a., component b., component c and any additional component(s) adds up to 100 wt. % of total solids.

In another embodiment of the aforementioned inventive composition, the wt. % of component a., the metal compound, as the total wt. % of all solid components, when component b., the polyol, is not present, is from about 20 wt. % to about 98 wt. %. In another aspect of this embodiment the wt. % total solid component is from about 25 wt. % to about 80 wt. %. In another aspect of this embodiment the wt. % total solid component is from about 30 wt. % to about 70 wt. % In another aspect of this embodiment the wt. % total solid component is from about 35 wt. % to about 65 wt. %. In another aspect of this embodiment the wt. % total solid component is from about 40 wt. % to about 60 wt. %. In another aspect of this embodiment the wt. % total solid component is from about 45 wt. % to about 55 wt. %. In another aspect of this embodiment the wt. % total solid component is from about 50 wt. %. In all the above described embodiment where component b. is absent the total combined solid wt. % solids of component and component c, if no other additional solid components are present. If an additional solid component is present the total wt. % solid of all solids, component a., component c and any additional other component(s) adds up to 100 wt. % of total solids.

Optional Component b., the Polyol

In one embodiment of the aforementioned inventive compositions, component b., the polyol, is present.

In another embodiment of the aforementioned inventive compositions, in component b., in the polyol additive having the structure (VI), this embodiment is one wherein, X is C.

In another embodiment of the aforementioned inventive compositions, in component b., in the polyol additive having the structure (VI), this embodiment is one wherein, X is N.

In another embodiment of the aforementioned inventive compositions, in component b., in the polyol additive having the structure (VI), this embodiment is one wherein, Y is a direct bond, methylene, ethylene or a moiety having the structure (VII).

In another embodiment of the aforementioned inventive compositions, in component b., in the polyol additive having the structure (VI), this embodiment this embodiment is one wherein, r is 2, 3 or 4.

In another embodiment of the aforementioned inventive compositions, in component b., in the polyol additive having the structure (VI), this embodiment is one wherein, $R_{14}$ is hydrogen.

In another embodiment of the aforementioned inventive compositions, in component b., in the polyol additive having the structure (VI), this embodiment is one wherein, q is 0, 1 or 2.

In another embodiment of the aforementioned inventive compositions, in component b., in the polyol additive having the structure (VI), this embodiment is one wherein, s is 0 or 2.

In another embodiment of the aforementioned inventive compositions, in component b., in the polyol additive having the structure (VI), this embodiment is one wherein, s is 0.

In another embodiment of the aforementioned inventive compositions, in component b., in the polyol additive having the structure (VI), this embodiment is one wherein, s is 2.

In another embodiment of the aforementioned inventive compositions, in component b., in the polyol additive having the structure (VI), this embodiment is one wherein, s is 1.

In another embodiment of the aforementioned inventive compositions, in component b., in the polyol additive having the structure (VI), when X is N, Y is a $C_1$-$C_8$ alkylene, or, when X is C, Y is selected from the group consisting of a direct valence bond, $C_1$-$C_8$ alkylene and moieties having the structure (VII), this embodiment is one wherein, $R_{15}$ is ethylene or propylene.

In another embodiment of the aforementioned inventive compositions, in component b., in the polyol additive having the structure (VI), when X is N, Y is a $C_1$-$C_8$ alkylene, or, when X is C, Y is selected from the group consisting of a direct valence bond, a $C_1$-$C_8$ alkylene and moieties having the structure (VII), this embodiment is one wherein, t is 1.

In another embodiment of the aforementioned inventive compositions, in component b., this embodiment is one wherein, in the polyol additive is selected from the group consisting of tetraethylene glycol, triethylene glycol, glycerol, triethanolamine, diethanolamine, neopentyl glycol, glycerol propoxylate, and pentaerythritol ethoxylate.

In another embodiment of the aforementioned inventive compositions, when component b., is present this embodiment is one wherein, in the polyol additive is selected from the group consisting of:

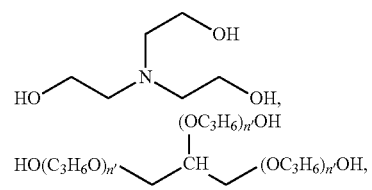

where n'=1-2,

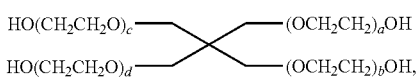

where a+b+c+d=3-4, HOCH$_2$CH$_2$NHCH$_2$CH$_2$OH,

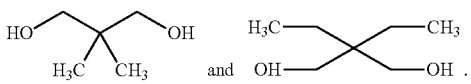

In another embodiment of the aforementioned inventive composition, when component b) is present it is selected from the group consisting of

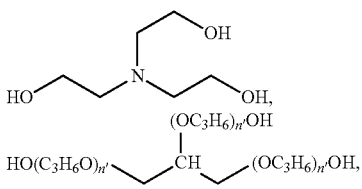

where n'=1-2,

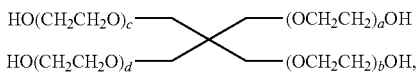

where a+b+c+d=3-4, and
HOCH$_2$CH$_2$NHCH$_2$CH$_2$OH.
In another embodiment of the aforementioned inventive composition, component b) is selected from

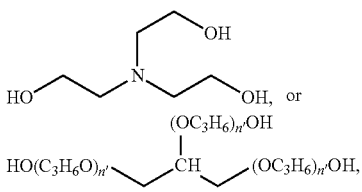

where n'=1-2.
In another embodiment of the aforementioned inventive composition, component b) is selected from

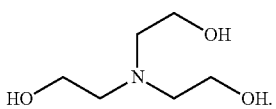

In another embodiment of the aforementioned inventive composition, when component b., the polyol, is present, the wt. % of this component as a wt. % of all solid components is about 1 wt. % to about 30 wt. %. In another aspect of this embodiment the wt. % total solid component is from about 5 wt. % to about 30 wt. %. In another aspect of this embodiment this wt. % of component b. as wt. % of total solid components is from about 10 wt. % to about 25 wt. %. In another aspect of this embodiment this wt. % of component b. as wt. % of total solid components, is from about 10 wt. % to about 20 wt. %. In another aspect of this embodiment this wt. % of component b. as wt. % of total solid components, is from about 12 wt. % to about 15 wt. %. In all the above described embodiment where component b. is present the total combined solid content, adds up to 100 wt. % of total solids, if no additional component is present. If an additional component is present, the total wt. % solid of all solids component a., component b., component c and any of these additional component(s) add up to 100 wt. % of total solids.

In another embodiment of the aforementioned inventive compositions, in component b., this embodiment is one wherein, in the polyol additive has a molecular weight of less than 500.

In another embodiment of the aforementioned inventive compositions, in component b., this embodiment is one wherein, the polyol additive has a molecular weight of less than 300.

In another embodiment of the aforementioned inventive compositions, in component b., the polyol additive has a boiling point of at least 200° C.

In another embodiment of the aforementioned inventive compositions, the polyol additive has a boiling point of at least 250° C.

In another embodiment of the aforementioned inventive compositions, the polyol additive has a boiling point of at least 400° C.

In another embodiment of the aforementioned inventive compositions, component c. the high performance polymer additive, is selected from the group consisting of polyethers, polyesters, polysulfones and polyethersulfones.

Component c., the High Performance Polymer

In another embodiment of the aforementioned inventive compositions, component c., the high performance polymer component, comprises a unit having the structure (VIII):

 (VIII)

wherein,
A comprises a fused aromatic ring;
B has the structure (IX):

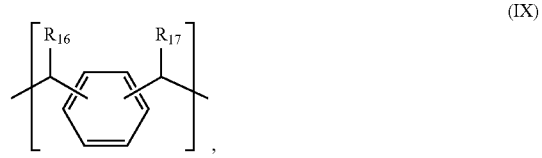 (IX)

wherein, $R_{16}$ and $R_{17}$ are each independently hydrogen or a $C_1$-$C_4$ alkyl; and C is a hydroxybiphenyl having the structure (X):

 (X)

In another embodiment of the aforementioned inventive compositions, component c. the high performance polymer additive the high performance polymer additive comprises a unit having the structure (VIII), wherein, A has the structure (XI):

 (XI)

wherein, D is a group comprising 2-8 fused aromatic rings.

In another embodiment of the aforementioned inventive compositions, component c. where the high performance polymer additive comprises a unit having the structure (VIII), this is an embodiment wherein, A has the structure (XI), and further wherein, D in this structure is anthracene.

In another embodiment of the aforementioned inventive compositions, where component c. the high performance polymer additive the high performance polymer additive comprises a unit having the structure (VIII), this is an embodiment wherein, A is anthracene.

In another embodiment of the aforementioned inventive compositions, where component c. the high performance polymer additive the high performance polymer additive comprises a unit having the structure (VIII), this is an embodiment wherein, A has the structure:

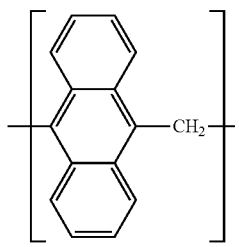

In another embodiment of the aforementioned inventive compositions, where component c. the high performance polymer additive the high performance polymer additive comprises a unit having the structure (VIII), this is an embodiment wherein, B has the structure:

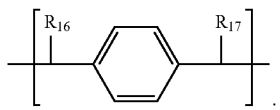

In another embodiment of the aforementioned inventive compositions, where component c. the high performance polymer additive the high performance polymer additive comprises a unit having the structure (VIII), this is an embodiment wherein, C has the structure:

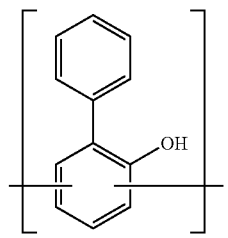

In another embodiment of the aforementioned inventive compositions, where component c. the high performance polymer additive the high performance polymer additive comprises a unit having the structure (VIII), wherein, C has the structure:

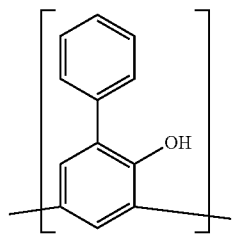

In another embodiment of the aforementioned inventive compositions, where the high performance polymer additive comprises a unit having the structure (VIII), wherein, A comprises a fused aromatic ring, B has the structure (IX), $R_{17}$ is hydrogen or a $C_1$-$C_4$ alkyl, and C is a hydroxybiphenyl having the structure (X), this is an embodiment wherein, $R_{16}$ is hydrogen or methyl.

In another embodiment, where the high performance polymer additive comprises a unit having the structure (VIII), wherein, A comprises a fused aromatic ring, B has the structure (IX), $R_{16}$ is hydrogen or a $C_1$-$C_4$ alkyl, and C is a hydroxybiphenyl having the structure (X), this is an embodiment wherein, $R_{17}$ is hydrogen or methyl.

In another embodiment of the aforementioned inventive compositions, where the high performance polymer additive comprises a unit having the structure (VIII), wherein, A comprises a fused aromatic ring, B has the structure (IX), R16 and $R_{17}$ are independently selected from hydrogen or a $C_1$-$C_4$ alkyl, and C is a hydroxybiphenyl having the structure (X), this embodiment of the high performance polymer additive further comprises a unit having the structure (XVI):

 (XVI)

wherein, E is a group comprising 2-8 fused aromatic rings.

In another embodiment of the aforementioned inventive compositions, component c, the high performance polymer additive comprises a unit having a structure selected from the group consisting of:

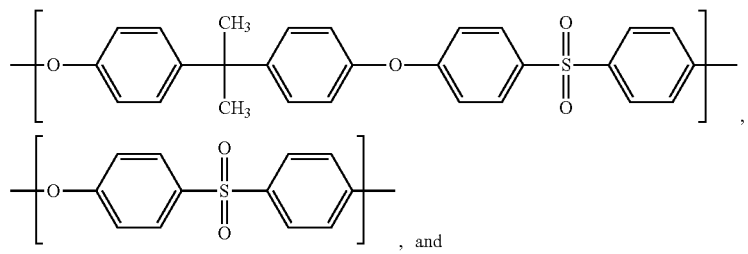

, and

-continued

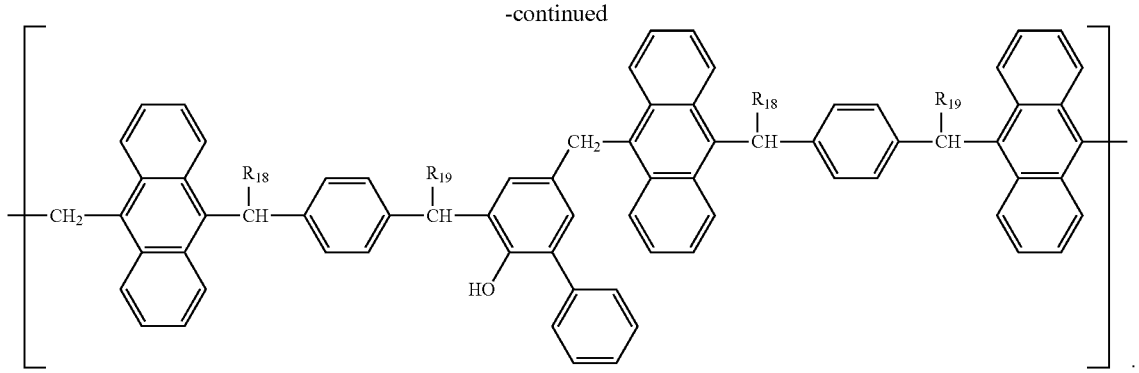

In another aspect of this embodiment, $R_{18}$ and $R_{19}$ are each independently hydrogen or a $C_1$-$C_4$ alkyl. In yet another embodiment $R_{18}$ is is hydrogen or methyl. In still another embodiment $R_{19}$ is hydrogen or methyl.

In another embodiment of the aforementioned inventive compositions, component c, the high performance polymer additive, is present in an amount that is from about 1 wt. % up to about 50 wt. % of the metal compound.

In another embodiment of the aforementioned inventive compositions, when component b., the polyol, is present, component c, the high performance polymer additive, is present as a wt. % of total solid components from about 1 wt. % to about 50 wt. %. In another aspect of this embodiment component b. is present from about 5 wt. % to about 50 wt. %. In another aspect of this embodiment component b. is present from about 10 wt. % to about 50 wt. %. %. In another aspect of this embodiment component b. is present from about 15 wt. % to about 50 wt. %. %. In another aspect of this embodiment component b. is present from about 20 wt. % to about 50 wt. %. %. In another aspect of this embodiment component b. is present from about 20 wt. % to about 45 wt. %. In another aspect of this embodiment component b. is present from about 20 wt. % to about 40 wt. %. In another aspect of this embodiment component b. is present from about 25 wt. % to about 35 wt. %. In all aspects of these embodiments to total wt. % of solids components a. b. and c., adds up, to 100 wt. %, if no additional solid components are present. If an additional solid component is present, the total wt. % solid of all solids component a., component b., component c and any additional component(s) adds up to 100 wt. % of total solids.

In another embodiment of the aforementioned inventive compositions, when component b. is not present, component c, the high performance polymer additive, is present in as a wt. % of total solid from about 1 wt. % to about 60 wt. %. In another aspect of this embodiment component c. is present from about 5 wt. % to about 60 wt. %. In another aspect of this embodiment component c. is present from about 10 wt. % to about 60 wt. %. %. In another aspect of this embodiment component c. is present from about 15 wt. % to about 55 wt. %. %. In another aspect of this embodiment component c. is present from about 20 wt. % to about 55 wt. %. %. In another aspect of this embodiment component c. is present from about 25 wt. % to about 55 wt. %. %. In another aspect of this embodiment component c. is present from about 30 wt. % to about 55 wt. %. In another aspect of this embodiment component c. is present from about 35 wt. % to about 55 wt. %. In another aspect of this embodiment component c. is present from about 40 wt. % to about 55 wt. %. In another aspect of this embodiment component c. is present from about 45 wt. % to about 55 wt. %. In another aspect of this embodiment component c. is present from about 50 wt. %. In all aspects of these embodiments when component b is absent the total wt. % of solids components a. and c. adds up to 100 wt. %, if no other additional solid components are present. If an additional solid component is present the total wt. % solid of all solids component a., component c and any other additional component(s) adds up to 100 wt. % of total solids.

Component d., the Solvent

The solvent usually is a solvent or solvent mixture containing alcohol, ester, ketone, lactone, diketones. Additional component (<1%) such as surfactant can be added to improve coating quality. The composition of the baked film contains 20-70% of total oxide at the above condition In the above described novel composition the solid components may be dissolved in a solvent component f) which is an organic solvent. Examples of suitable organic solvents include, without limitation, 1-Methoxy-2-propanyl acetate (PGMEA), 1-Methoxy-2-propanol (PGME) butyl acetate, amyl acetate, cyclohexyl acetate, 3-methoxybutyl acetate, methyl ethyl ketone, methyl amyl ketone, cyclohexanone, cyclopentanone, ethyl-3-ethoxy propanoate, methyl-3-ethoxy propanoate, methyl-3-methoxy propanoate, methyl acetoacetate, ethyl acetoacetate, diacetone alcohol, methyl pivalate, ethyl pivalate, propylene glycol monomethyl ether, propylene glycol monoethyl ether, propylene glycol monomethyl ether propanoate, propylene glycol monoethyl ether propanoate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethyl sulfoxide, gamma-butyrolactone, gamma valerolactone, propylene glycol methyl ether acetate, propylene glycol ethyl ether acetate, propylene glycol propyl ether acetate, methyl lactate, ethyl lactate, propyl lactate, tetramethylene sulfone, propylene glycol dimethyl ether, dipropylene glycol dimethyl ether, ethylene glycol dimethyl ether or diethylene glycol dimethyl ether, and anisole. These solvents may be used singly or in a mixture of two or more.

In one embodiment the solid components are dissolved in PGMEA/PGME 70:30.

In another embodiment of the aforementioned inventive compositions, component d, the solvent, is selected from the group consisting of alcohols, esters, ketones, lactones, diketones, aromatic moieties, carboxylic acids, amides and mixtures thereof.

In one embodiment the solvent is cyclohexanone.

Optional Components

In another embodiment of the aforementioned inventive compositions, in addition to components a. b. c. and d. these compositions may further comprise at least one additional component selected from the group consisting of surfactants, levelling agents, crosslinking additives and thermally activated catalysts.

Optional component such as surfactant can be added to improve coating quality in small amount such as level smaller than 1 wt. %.

More specifically, which have compatibility with and can be added to the novel composition disclosed and claimed herein according to need, include auxiliary resins, plasticizers, surface leveling agents and stabilizers to improve the properties of the coated composition on the surface, and the like. Surface leveling agents may include surfactants. There is no particular restriction with regard to the surfactant, and the examples of it include a polyoxyethylene alkyl ether such as polyoxyethylene lauryl ether, polyoxyethylene stearyl ether, polyoxyethylene cetyl ether, and polyoxyethylene olein ether; a polyoxyethylene alkylaryl ether such as polyoxyethylene octylphenol ether and polyoxyethylene nonylphenol ether; a polyoxyethylene polyoxypropylene block copolymer; a sorbitane fatty acid ester such as sorbitane monolaurate, sorbitane monovalmitate, and sorbitane monostearate; a nonionic surfactant of a polyoxyethylene sorbitane fatty acid ester such as polyoxyethylene sorbitane monolaurate, polyoxyethylene sorbitane monopalmitate, polyoxyethylene sorbitane monostearate, polyethylene sorbitane trioleate, and polyoxyethylene sorbitane tristearate; a fluorinated surfactant such as F-Top EF301, EF303, and EF352 (manufactured by Jemco Inc.), Megafac F171, F172, F173, R08, R30, R90, and R94 (manufactured by Dainippon Ink & Chemicals, Inc.), Florad FC-430, FC-431, FC-4430, and FC-4432 (manufactured by Sumitomo 3M Ltd.), Asahi Guard AG710, Surflon S-381, S-382, S-386, SC101, SC102, SC103, SC104, SC105, SC106, Surfinol E1004, KH-10, KH-20, KH-30, and KH-40 (manufactured by Asahi Glass Co., Ltd.); an organosiloxane polymer such as KP-341, X-70-092, and X-70-093 (manufactured by Shin-Etsu Chemical Co., Ltd.); and an acrylic acid or a methacrylic acid polymer such as Polyflow No. 75 and No. 95 (manufactured by Kyoeisha Yushikagaku Kogyo K. K.).

In another embodiment of the aforementioned inventive compositions, is wherein, the surfactant is present in an amount that is less than 1% of the total weight of the composition.

Compositions: Content of Total Solid Components in Solvent

In one embodiment the total wt. % solid content of all solid components in solvent (wt/wt) for these novel composition ranges from about 1 wt. % to about 40 wt. % total solid components in this solvent. In another embodiment from about 2 wt. % to about 40 wt. %. In yet another embodiment of this aspect of the invention, from about 5 wt. % to about 35 wt. %. In yet another embodiment of this aspect of the invention, the wt. % of solid components is from about 10 wt. % to about 35 wt. %. In yet another embodiment of this aspect of the invention, from about 10 wt. % to about 35 wt. %. In still another embodiment of this aspect of the invention, the wt. % of solid components is from about 15 wt. % to about 30 wt. %. In another from about 20 wt. % to about 30 wt. %. In yet another embodiment of this aspect of the invention, the wt. % of solid components is about 25 wt. %.

Method of Using Composition
Process for Filling Voids in Substrate Having Topographical Features.

One aspect of this invention is a process of manufacturing an electronic device by forming a patterned high K materials produced by filling voids such a Vias in a patterned substrate, by a coating process with any of the above described novel compositions. The patterned substrate may be a patterned semiconductor (Silicon, germanium and the like), a patterned spin on carbon, or a patterned resist. The resultant patterned material, apart from its utility as a high K material, may alternatively be used in the manufacturing of electronic devices, in the role of a hard mask. This patterned hard mask, by virtue of the refractory nature of the content of metal compounds in the inventive composition which imparts high etch resistance to various plasmas, and allows a pattern to be etched and transferred into the substrate.

The novel compositions may be applied to a substrate (unpatterned or patterned substrate) to form a coating film as follows:

a) Applying any one of the above described inventive compositions, onto a substrate to form a coating film; and
b) Heating the coating film at a temperature between 150° C. and 400° C. and for a time from 30 to 240 seconds, forming a cured coating film.

In another aspect of this embodiment, the coating film is heated for a time of up to 120 seconds. In another aspect, the inventive hard mask composition is applied onto the substrate by a spin-on coating process. In yet another aspect this composition is applied onto the substrate in step a) by a one-step spin-on coating process to form the coating film.

In one embodiment of this process, pertaining to the inventive composition's utility as a void filling material, the substrate coated with the composition to form the coated film is a patterned substrate comprising topographical features. In this instance, said coating film is coated with a thickness sufficient such that it and the cured coating film formed in step b) overlays said topographical features, and further wherein, after baking the film in step b), the process further comprises an additional step, step c) as follows:

c) Removing the portion of said cured coating film overlaying the top of the topography using a chemical stripper or a fluorinated plasma etch, thereby producing filled topographical features wherein the cured coating film is flush with the top of said topographical features.

In another embodiment of this void filling aspect of the inventive process, said topographical features are in a patterned spin on carbon layer overlying a silicon substrate. In another embodiment of this process, said topographical features are in a patterned semiconductor such as silicon, germanium and the like. In yet another, said topographical features are in a patterned resist overlaying said semiconductor substrate. In yet another embodiment of any of these void filling inventive processes, the said topographical features filled are Vias. In yet another embodiment of any of these void filling processes the said topographical features are Contact holes, Vias or a mixture of both.

In still another embodiment, of the any of these processes, when the topographical features are a patterned photoresist or a patterned organic high carbon coating, overlying a semiconductor substrate (e.g. Silicon, Germanium and the like), the processes further comprise, after step c), an additional step, step d), as follows:

d) Removing said patterned organic high carbon coating or said patterned photoresist with an oxygen plasma, thereby forming a negative tone image of said patterned photoresist, or said patterned organic high carbon coating, wherein, the remaining said filled topographic features, after removal of said patterned photoresist or said patterned organic high carbon coating, forms a pattern comprised of metal oxide. In one aspect of this invention, this pattern comprised of metal oxide has utility as either a patterned high K material, useful in producing microelectronic components incorporating such a high K material. Alternatively, in another aspect of this invention, the pattern comprised of a metal oxide, may be used as a patterned hard mask for pattern transfer into the underlying semiconductor substrate using an approximate plasma such as a fluorinated plasma and the like.

In the inventive process in which the remaining patterned novel composition after step d) is not used as a patterned high K material, but as a patterned hard mask, the above inventive process comprises an additional step, after step d), step e) as follows:

e) Using said pattern comprised of metal oxide as patterned hard mask, etch barrier, and etching into the semiconductor substrate with a fluorinated plasma.

In still another embodiment of the any of these above processes (a.k.a. either to produce a patterned high K material or a patterned hard mask, said topographical features have an aspect ratio of 1:1 to 10:1. In still another embodiment of the any of these processes said topographical features have an aspect ratio of 1 to 10 and may be selected from ones that range in critical dimension (CD) from 5 nm to 100 nm.

In still another embodiment of any above described processes in step b) baking the film at a temperature from 150° C. to 400° C., is done in two baking steps b1) and b2) where baking step b1) is done from 250° C. to 275° C. and baking step b2) is done from 300° C. to 400° C. In another aspect of this embodiment, said baking step b1) is 200° C. to 250° C. and the baking step b2) is 350° C. to 400° C. In another embodiment of this aspect, said baking step b1) is 250° C. and the baking step b2) is 400° C. In yet another aspect, said baking step b1) is done for 30 to 120 seconds and said baking step b2) is done for 60 to 120 seconds. In still another aspect, said baking step b1 is done for 60 seconds to 120 seconds and said baking step b2) is done for 90 second to 120 seconds. In yet another aspect, said baking step b1) is done for 60 seconds. In still another aspect said baking step b2) is done for 120 seconds.

In still another aspect, said baking step b1 is done for 1 minute and said baking step b2) is done for 120 seconds. In yet another aspect, said baking step b1) is done for 60 seconds. In still another aspect said baking step b2) is done for 120 seconds.

Process for Using the Inventive Compositions on a Silicon Substrate to Produce a Patterned Hard Mask Another aspect of this invention is a process for producing a patterned hard mask on an unpatterned substrate, using any one of the above described inventive hard mask compositions, and using this pattern to create a patterned substrate, wherein, this process comprises steps a3) to h3) as follows:

a3) Applying a composition from any one of claims 1 to 94 onto said substrate to form a coating film, b3) Baking the coating film at a temperature from 150° C. to 400° C. to form a hard mask film c3) Coating a bottom antireflective coating on top of said hard mask film, d3) Coating a photoresist on top of said antireflective coating, e3) Patterning the photoresist resist forming a photoresist pattern, f3) Etching through said bottom antireflective coating not protected by said photoresist pattern down to the hard mask coating with a fluorinated plasma, g3) Etching through said hard mask not protected by the bottom antireflective coating and said photoresist pattern down to the silicon substrate with a chlorine plasma producing a patterned hard mask film, h3) etching with a fluorinated plasma into the silicon substrate in those area not protected by said patterned hard mask film producing topographical features into the silicon features.

In another aspect of this process in step in b3) the film is baked at a temperature from 150° C. to 400° C. is done in two baking steps b1') and b2') where baking step b1') is done from 150° C. to 250° C. and baking step b2') is done from 300° C. to 400° C. In another aspect of this embodiment, said baking step b1') is 200° C. to 250° C. and the baking step b2') is 350° C. to 400° C. In another aspect of this embodiment, said baking step b1') is 250° C. and the baking step b2') is 400° C. In yet another aspect said baking step b1') is done for 30 seconds to 120 seconds and said baking step b2') is done for 60 seconds to 120 seconds.

In still another aspect, the baking step b1') is done for 90 to 120 seconds. In yet another aspect said baking step b2') is done for 90 seconds to 120 seconds.

In still another, said baking step b1') is done for 60 seconds and said baking step b2') is done for 120 seconds.

In one embodiment the cured films of inventive composition cured as described above contains about 15 wt. % to about 75 wt. % total metal oxide. In another aspect of this embodiment the cured films contain from about 20 wt. % to about-70 wt. % metal oxide.

As discussed above, patterned cured inventive composition films, used as patterned hard masks, are produced in two manners, as follows: 1) Through a filling of topographical features comprised of patterned photoresist or patterned organic high carbon coating on as semiconductor substrate; or, 2) through a photoresist patterning process of a cured film of the inventive composition on an unpatterned semiconductor substrate. In either case, after etch transfer with a fluorine plasma, some of the patterned hard mask, after this transfer. In this instance, any remaining hard mask pattern is the strippable in chemical solutions.

EXAMPLES

Reference will now be made to more specific embodiments of the present disclosure and experimental results that provide support for such embodiments. However, Applicants note that the disclosure below is for illustrative purposes only and is not intended to limit the scope of the claimed subject matter in any way.

The molecular weight of the polymers was measured on a Gel Permeation Chromatograph using a Water 2695 Alliance Separation Module, or equivalent equipped with a Waters Dual Wavelength UV Detector, Model 2487, or equivalent and a Waters Differential Refractometer, Model 2414, Dectector equivalent, a Shodex Columns set as follows: one Shodex GPC KF-801 ($1.5 \times 10^3$) column, Two Shodex GPC KF-802 ($5 \times 10^3$) columns and one Shodex GPC KF-804 ($4 \times 10^5$) column. The mobile phase was UV stabilized THE HPLC grade and the molecular weight standard was as set of polystyrene standards supplied by American Standards Corporation and Millipore Corporation or equivalent.

AZ®ArF Thinner (ArF thinner) (a.k.a. 70/30 PGMEA/PGME) was obtained from EMD Performance Materials Corp. (70, Meister Ave., Somerville, N.J.). Ti(IV), Butoxide Polymer (BTP), Pentaerythritol ethoxylate (3/4 EO/OH) and other chemicals, unless otherwise indicated, were purchased from the Sigma-Aldrich Corp (St. Louis, Mo., USA).

The refractive index (n) and the extinction coefficient (k) values of the examples metal oxide coatings below were measured on a J. A. Woollam VASE32 ellipsometer.

Thermogravetric measurements use to measure Ti wt. % or content of other metals were done using A Perkin Elmer Thermogravimetric Analyzer TGA7 with heating from 50° C. to 800° C. at a heating rate of 120° C./min in a $O_2$ atmosphere and maintaining this temperature for 60 minutes.

Elemental analysis used to measure Ti or content of other metal content in wt. % and Si content in wt. % were done by Intertek of Whitehouse NJ.

The amount of the high performance polymer additives is usually less than 100% of the metal compound, preferably less than 50% of the metal compound.

The solvent usually is a solvent or solvent mixture containing alcohol, ester, ketone, lactone, diketones. Additional component (<1%) such as surfactant can be added to improve coating quality.

Synthesis Example 1

200 g. of Hf(IV) tetra n-butoxide (0.4247 mole) was dissolved in 276 g of 70/30 PGMEA/PGME and poured into the reaction vessel under $N_2$. The temperature was raised to 50° C. at stirring while trimethylsilanol 76 g. 0.8426 mole) was added dropwise in above solution with stirring under $N_2$. The reaction was kept at 60° C. for 2 h. 127 g of 1,2-cyclohexanedicarboxylic anhydride (0.8238 mole) and 127 g. of 70/30 PGMEA/PGME were then mixed with the above reaction mixture and the reaction was continued at 60° C. for about one hour. After cooling down to room temperature overnight, the product was stored in a brown bottle and sealed carefully. The measured total Hf content was 45 wt. % in films after baking at 250° C. for 60 s.

Synthesis Example 2

200 g. of Zr tetra n-butoxide (80% in n-butanol) (0.4170 mole) was dissolved in 246.5 g of 70/30 PGMEA/PGME and poured into the reaction vessel under $N_2$. The temperature was raised to 50° C. at stirring while trimethylsilanol 77.5 g. (0.8592 mole) was added dropwise in above solution with stirring under $N_2$. The reaction was kept at 60° C. for 2 h. 103 g. of 1,2-cyclohexanedicarboxylic anhydride (0.66814 mole) and 103 g of 70/30 PGMEA/PGME were then mixed with the above reaction mixture and the reaction was continued at 60° C. for about one hour. After cooling down to room temperature overnight, the product was stored in a brown bottle and sealed carefully. FT-IR spectrum of the product solution was taken in cyclohexane. The resonance at 1559 $cm^{-1}$ and 1456 $cm^{-1}$ was assigned to COO stretching frequency of in Zr complex. The measured total Zr content was 26.8 wt. % in films after baking at 250° C. for 60 s.

Synthesis Example 3

20 g. of Zr n-butoxide (80% in n-butanol) (0.0417 mole) was dissolved in 27.6 g. of 70/30 PGMEA/PGME and poured into the reaction vessel under $N_2$. The temperature was raised to 50° C. with stirring while trimethylsilanol 7.6 g. (0.08426 mole) was added dropwise in above solution with stirring under $N_2$. The reaction was kept at 60° C. for 2 h. 9.3 g of citraconic anhydride and 9.3 g (0.08300 mole) of 70/30 PGMEA/PGME were then mixed with the above reaction mixture and the reaction was continued at 60° C. for about one hour. After cooling down to room temperature overnight, the product was stored in a brown bottle and sealed carefully. FT-IR spectrum of the product solution was taken in cyclohexane. The resonance at 1565 cm-1 and 1454 cm-1 was assigned to COO stretching frequency of in Zr complex. The measured total Zr content was 25.4 wt. % in films after baking at 250° C. for 60 s.

Synthesis Example 4

A solution was prepared consisting of 12.76 g. (0.075 mole) 2-phenylphenol, 15.62 g. (0.075 mole) 9-Anthracene Methanol, 9.76 g. (0.075 mole) divinylbenzene dissolved in 25 g cyclopepentyl methyl ether (CPME) and 90 g. diethylene glycol dimethyl ether (DEGME) and the mixture was stirred for 5 minutes in a 250 mL, 4 neck flask equipped with an overhead mechanical stirrer, condenser, thermo watch, Dean Stark trap and an $N_2$ purge. After this time, 1.14 g. of triflic acid (3% wt of monomers) was added to the stirred mixture and it was stirred for another 5 minutes. The temperature of the stirred mixture was then raised to 140° C. and heated for 3 hours. After cooling the reaction mixture and diluting it with 250 mL of cyclopentyl methyl ether (CPME), it was transferred to a separatory funnel, and it was washed with two aliquots of deionised (DI) water (2.times.200 mL). The polymer was precipitated by drowning into hexane. The polymer was filtered, washed and dried. The polymer was dissolved in THF and isolated using hexane two additional times to remove all monomer and oligomers. This process yielded 40% finished polymer from the starting materials. The weight average molecular weight of the polymer was 1,859 with a polydispersity of 1.40.

Synthesis Example 5

40 g. of Titanium(IV) butoxide polymer (Ti(IV)BTP polymer) (Sigma-Aldrich Corporation, St Louis Mo.) (0.1174 mole), (was dissolved in 52 g of 70/30 PGMEA/PGME solvent and poured into the reaction vessel under $N_2$. This solution was stirred and its temperature raised to 50° C. while trimethylsilanol 12 g. (0.1330 mole) was added dropwise under $N_2$. The reaction mixture was kept at 60° C. for 2 hours, after which time 20 g. of 1,2-cyclohexanedicarboxylic anhydride (0.1297 mole) and 20 g. of 70/30 PGMEA/PGME were mixed with the above reaction mixture and the reaction was continued at 60° C. for about one hour. After cooling down to room temperature overnight, the product was stored in a brown bottle and sealed carefully. FT-IR spectrum of the product solution was taken in cyclohexane. The resonance at 970 cm-1 was assigned to Ti—O—Si stretching frequency. The measured total metal oxide content was 28 wt. % in films after baking at 150° C. for 60 s.

Synthesis Example 6

40 g. of Ti(IV)BTP polymer (0.1175 mole) was dissolved in 58 g. of 70/30 PGMEA/PGME solvent and poured into the reaction vessel under $N_2$. The temperature was raised to 50° C. while stirring and trimethylsilanol 18 g. (0.1996 mole) was added dropwise under $N_2$. The reaction was kept at 60° C. for 2 hours. Then 20 g. of 1,2-cyclohexanedicarboxylic anhydride (0.1297 mole) and 20 g. of 70/30 PGMEA/PGME solvent was mixed with the reaction mixture and the reaction was continued at 60° C. for about one hour. After cooling down to room temperature overnight, the product was stored in a brown bottle and sealed carefully. The measured total metal oxide content was 32 wt. % in films after baking at 150° C. for 60 s.

Synthesis Example 7

7.99 g. [0.0235 mole] of Ti(IV)BTP polymer was dissolved in 14.36 g. of 70/30 PGMEA/PGME solvent and poured into the reaction vessel under $N_2$. The temperature was raised to 50° C. while stirring and Then 7.0 g. [0.0455 mole] of 1,2-cyclohexanedicarboxylic anhydride and 10.5 g. of 70/30 PGMEA/PGME solvent was added slowly under $N_2$. The reaction was kept at 60° C. for 2 hours. Then 9.8 g. [0.0465 mole] of p-tolyltriemethoxy silane was added and the reaction was continued at 60° C. for about three hours. After cooling down to room temperature overnight, the product was stored in a brown bottle and sealed carefully. FT-IR spectrum of the product solution was taken. The resonance at 1568.06 cm-1 and 970 cm-1 were assigned to Ti—O—C and Ti—O—Si stretching frequency respectively.

Formulation and Coating Example 1

25% wt/wt solutions containing of 20.0 wt. % of metal compound from Synthesis Example 1 and 5.0% of triethanolamine are prepared in PGMEA/PGME 70:30 solvent. After sufficient mixing, the solution was spin-coated on the silicon wafer and bake at 250° C. for 60 seconds. The coated wafer shows good coating quality by XSEM picture.

Formulation and Coating Example 2

25% wt/wt solutions containing of 20 wt. % of metal compound from Synthesis Example 2 (or Synthesis Example 3) and 5% of triethanolamine are prepared in PGMEA/PGME 70:30 solvent. After sufficient mixing, the solution was spin-coated on the silicon wafer and bake at 250 C for 60 seconds. The coated wafer shows good coating quality by XSEM picture.

Formulation and Coating Example 3

20% wt/wt solutions containing of 14 wt. % of metal compound from Synthesis Example 2 (or Synthesis Example 3) and 6% of triethanolamine are prepared in PGMEA/PGME 70:30 solvent. After sufficient mixing, the solution was spin-coated on the silicon wafer and bake at 250 C for 60 seconds. The coated wafer shows good coating quality by XSEM picture.

Formulation and Coating Example 4

20% wt/wt solutions containing of 13.3 wt. % of metal compound from Synthesis Example 1, 3.3% of triethanolamine and 3.3% of polymer from synthesis example 4 are prepared in PGMEA/PGME 70:30 solvent. After sufficient mixing, the solution was spin-coated on the silicon wafer and bake at 250 C for 60 seconds. The coated wafer shows good coating quality by XSEM picture.

Formulation and Coating Example 5

20% wt/wt solutions containing of 13.3 wt. % of metal compound from Synthesis Example 2, 3.3% of triethanolamine and 3.3% of polymer from synthesis example 4 are prepared in PGMEA/PGME 70:30 solvent. After sufficient mixing, the solution was spin-coated on the silicon wafer and bake at 250 C for 60 seconds. The coated wafer shows good coating quality by XSEM picture.

Formulation and Coating Example 6

20% wt/wt solutions containing of 11.4 wt. % of metal compound from Synthesis Example 5, 2.9 wt. % of triethanolamine and 5.7 wt. % of polymer from synthesis example 4 are prepared in cyclohexanone solvent. After sufficient mixing, the solution was spin-coated on the silicon wafer and bake at 250 C for 60 seconds. The coated wafer shows good coating quality by XSEM picture.

Formulation and Coating Example 7

20% wt/wt solutions containing of 10 wt. % of metal compound from Synthesis Example 6 and 10 wt. % of polymer from synthesis example 4 are prepared in PGMEA/PGME 70:30 solvent. After sufficient mixing, the solution was spin-coated on the silicon wafer and bake at 250 C for 60 seconds. The coated wafer shows good coating quality by XSEM picture.

Determination of Metal Wt. % in Films after Baking Example 1

Formulation examples 1-5 was coated and baked at appropriate temperature normally at 250° C./60 s-300° C./60 s. on a silicon wafer. Metal wt. % in the films were measured by elemental analysis and TGA weight loss measurement. The results from two methods are consistent. The measured total metal oxide content is ranging from 20 to 40 wt. % in films at 250° C./60 s.-300° C./60 s baking conditions. The film is mostly comprised of metal compounds with little silicon content based on elemental analysis in all cases.

Via Filling Performance Evaluation Example 1

Formulation examples 1-5 was coated and baked at appropriate temperature normally at 250° C./60 s. targeting a film thickness of 250 nm. The coated wafers for example 4-5 were subsequently baked at 400° C./120 s on a silicon wafer from Albany. The Albany wafers have 650 nm deep Vias with 130, 140, 160, 200 and 300 nm via sizes. Via holes were patterned at various pitches: dense, semi-dense and isolated with hole to space ratios at 1:1, 1:1.4 and 1:6. Other via wafer used has 700 nm deep Vias with 140 nm via size. The coated wafers were examined under a scanning electron microscope. The good filling performances were observed without any voids under above processing conditions.

Trench Filling Performance Evaluation Example 1

The solution of Formulation Example 1-5 with the adjusted solid content targeting final film thickness of 250 nm at 250° C./60 s baking temperature was spin-coated on a patterned wafer with trench size of 100 nm (depth)×15 nm (width) and line/space (L/S) 1:1 at a spin speed of 1500 rpm. The coated wafers for formulation examples 4-5 were subsequently baked at 400° C./120 s. The Cross-section scanning electron microscope (XSEM) data showed excellent film coating quality and good filling performances.

Comparative Via Filling Performance Evaluation Example 1

Formulation examples 1-5 was coated and baked at appropriate temperature normally at 250° C./60 s. targeting a film thickness of 250 nm. The coated wafers for example 1-3 were subsequently baked at 300° C./120 s on a silicon wafer from Albany. The Albany wafers have 650 nm deep Vias with 130, 140, 160, 200 and 300 nm via sizes. Via holes were patterned at various pitches: dense, semi-dense and isolated with hole to space ratios at 1:1, 1:1.4 and 1:6. Other via wafer used has 700 nm deep Vias with 140 nm via size. The coated wafers were examined under a scanning electron microscope. Voids in the Vias were observed by cross-section imaging.

Comparative Trench Filling Performance Evaluation Example 1

The solution of Formulation Example 1-5 with the adjusted solid content targeting final film thickness of 250 nm at 250° C./60 s baking temperature was spin-coated on a patterned wafer with trench size of 100 nm (depth)×15 nm (width) and line/space (L/S) 1:1 at a spin speed of 1500 rpm. The coated wafers for formulation examples 1-3 were subsequently baked at 300° C./120 s. The Cross-section scanning electron microscope (XSEM) data showed voids in the trench filling.

Formulation and Coating Example 6

100% wt/wt solutions containing of 80.0 wt. % of metal compound from Synthesis Example 7 and 20.0% of triethanolamine, and 20.0% of u-981 polymer are prepared in PGMEA/PGME 70:30 solvent. After sufficient mixing, the solution was spin-coated on the silicon wafer and bake at 250° C. for 60 seconds. The coated wafer shows good coating quality by XSEM picture.

Determination of Metal Wt. % in Films after Baking Example 2

Formulation examples 1 7 was coated and baked at appropriate temperature normally at 250° C./60 s on a silicon wafer. Metal wt. % in the films were measured by elemental analysis and TGA weight loss measurement. The results from two methods are consistent. The measured total metal oxide content is 29.735 wt. % in films at 250° C./60 s baking conditions.

Via Filling Performance Evaluation Example 2

Formulation examples 7 was coated and baked at appropriate temperature normally at 250° C./60 s targeting a film thickness of 250 nm. The Albany wafers have 650 nm deep Vias with 130, 140, 160, 200 and 300 nm via sizes. Via holes were patterned at various pitches: dense, semi-dense and isolated with hole to space ratios at 1:1, 1:1.4 and 1:6. Other via wafer used has 700 nm deep Vias with 140 nm via size. The coated wafers were examined under a scanning electron microscope. The good filling performances were observed without any voids under above processing conditions.

Via Filling Performance Evaluation Example 3

Formulation examples 6 was coated and baked at appropriate temperature normally at 250° C./60 s which was subsequently baked at 400° C./60 s targeting a film thickness of 250 nm on a silicon wafer. The Albany wafers have 600 nm deep vias with 70, 75, 80, 90 and 100 nm via sizes. Via holes were patterned at various pitches: dense, semi-dense and isolated with hole to space ratios at 1:1, 1:1.5 and 1:9. The coated wafers were examined under a scanning electron microscope. The good filling performances were observed without any voids under above processing conditions.

Via Filling Performance Evaluation Example 4

Formulation examples 7 was coated and baked at appropriate temperature normally at 250° C./60 s which was subsequently baked at 400° C./60 s targeting a film thickness of 250 nm on a silicon wafer. The Albany wafers have 600 nm deep vias with 70, 75, 80, 90 and 100 nm via sizes. Via holes were patterned at various pitches: dense, semi-dense and isolated with hole to space ratios at 1:1, 1:1.5 and 1:9. The coated wafers were examined under a scanning electron microscope. The good filling performances were observed without any voids under above processing conditions.

We claim:
1. A composition comprising:
a. a metal compound having the structure (I):

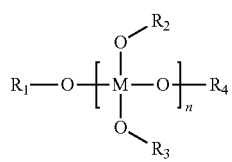

wherein,

M is a metal having a valence of four (4);

n is an integer from 1 to 20;

each of $R_1$, $R_2$, $R_3$, and $R_4$ is independently selected from the group consisting:

1) a first organic moiety having the structure (II):

wherein, $R_5$ is selected from the group consisting of $C_2$-$C_{10}$ alkylenes, $C_3$-$C_{12}$ branched alkylenes, $C_5$-$C_{12}$ cycloalkylenes, $C_2$-$C_{10}$ alkylenes containing a C=C double bond, $C_3$-$C_{12}$ branched alkylenes containing a C=C double bond, and $C_5$-$C_{12}$ cycloalkylenes containing a C=C double bond; and $R_6$ is hydrogen or an alkyloxycarbonyl having the structure (III):

wherein, $R_7$ is a $C_1$-$C_8$ alkyl;

2) a silicon bearing organic moiety having at least 2 carbons and having the structure (IV):

wherein, $R_8$ and $R_9$ are each independently selected from the group consisting of $C_1$-$C_8$ alkyls, $C_3$-$C_{12}$ branched alkyls, $C_1$-$C_8$ alkyloxys, $C_3$-$C_{12}$ branched alkyloxys, and $C_6$-$C_{16}$ aryls;

$R_{10}$ is selected from the group consisting of $C_1$-$C_8$ alkyls, $C_6$-$C_{16}$ aryls, hydroxyl and siloxanes having the structure (V):

wherein, $R_{11}$ is selected from the group consisting of hydrogen, $C_1$-$C_8$ alkyls, $C_1$-$C_8$ alkyls substituted with a hydroxyl, a $C_6$-$C_{16}$ aryl, and a silyl moiety having structure (IVa):

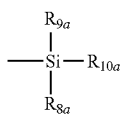
(IVa)

wherein, $R_{8a}$ and $R_{9a}$ are each independently selected from the group consisting of $C_1$-$C_8$ alkyls, $C_3$-$C_{12}$ branched alkyls, $C_1$-$C_8$ alkyloxys, $C_3$-$C_{12}$ branched alkyloxys, and $C_6$-$C_{16}$ aryls, and $R_{10a}$ is selected from the group consisting of $C_1$-$C_8$ alkyls, and a $C_6$-$C_{16}$ aryls;

$R_{12}$ and $R_{13}$ are each independently selected from the group consisting of $C_1$-$C_8$ alkyls, $C_3$-$C_{12}$ branched alkyls, $C_1$-$C_8$ alkyloxys, $C_3$-$C_{12}$ branched alkyloxys, and $C_6$-$C_{16}$ aryls; and p represents the number of repeat units in the siloxane moiety (V);

3) a second organic moiety selected from the group consisting of $C_2$-$C_8$ alkyls, $C_2$-$C_8$ alkyl carboxyls, $C_6$-$C_{20}$ aryl carboxyls, fluorenyl carboxyls, fluorinated $C_2$-$C_8$ alkyl carboxyls, $C_2$-$C_8$ alkyl sulfonyls, fluorinated $C_2$-$C_8$ alkyl sufonyls, and mixtures thereof; and 4) mixtures thereof;

b. an optional component comprised of a polyol additive having the structure (VI):

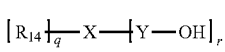
(VI)

wherein,
X is C or N;
r is at least 2;
q is from 0 to 2;
provided that the sum of q and r is 4 when X is C, and the sum of q and r is 3 when X is N;
$R_{14}$ is selected from the group consisting of hydrogen, $C_1$-$C_8$ alkyls and $C_2$-$C_8$ hydroxyalkyls;
when X is N, Y is a $C_1$-$C_8$ alkylene, or, when X is C, Y is selected from the group consisting of a direct valence bond, $C_1$-$C_8$ alkylenes and moieties having the structure (VII):

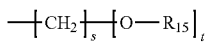
(VII)

wherein,
R15 is a $C_2$-$C_8$ alkylene;
s is 0 to 2; and
t is 1 to 2;

c. a high performance polymer additive comprising a unit having the structure (VIII):

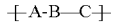
(VIII)

wherein,
A comprises a fused aromatic ring;
B has the structure (IX):

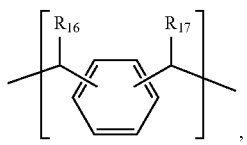
(IX)

wherein, $R_{16}$ and $R_{17}$ are each independently hydrogen or a $C_1$-$C_4$ alkyl; and C is a hydroxybiphenyl having the structure (X):

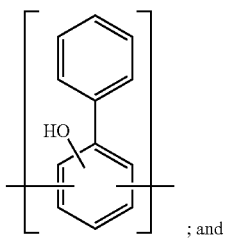
(X)

; and d. a solvent.

2. The composition of claim 1, wherein, M is selected from the group consisting of Zr, Ta, Hf, Ti, Sn, Si, Pb, Nb, Mo, Ge and W.

3. The composition of claim 1, wherein component a is a mixture of two or more different metal compounds having structure (I).

4. The composition of claim 1, wherein at least one metal compound in the mixture does not have M equal to Si.

5. The composition of claim 1, wherein at least one of $R_1$, $R_2$, $R_3$ and R4 is selected from the group consisting of a first organic moiety having the structure (II) and a silicon bearing organic moiety having at least 2 carbons and having the structure (IV).

6. The composition of claim 1, wherein at least one of $R_1$, $R_2$, $R_3$ and $R_4$ is selected from the group consisting of:

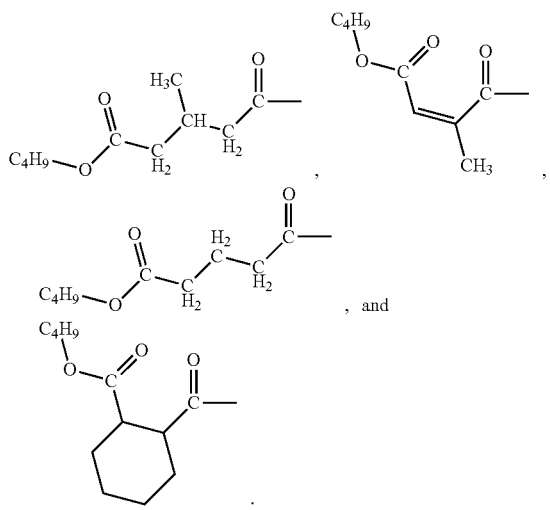

7. The composition of claim 1, wherein each of $R_1$, $R_2$, $R_3$ and $R_4$ is independently selected from the group consisting of a first organic moiety having the structure (II) and a silicon bearing organic moiety having at least 2 carbons and having the structure (IV).

8. The composition of claim 1, wherein n is 2-20.

9. The composition of claim 1, wherein n is 1.

10. The composition of claim 1, wherein A is anthracene.

11. The composition of claim 1, wherein A has the structure:

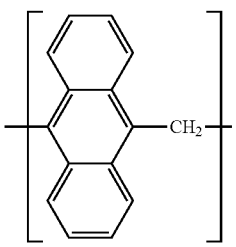

12. The composition of claim 1, wherein C has the structure:

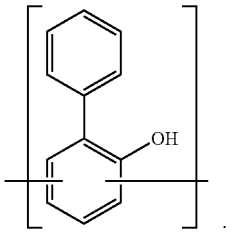

13. The composition of claim 1, wherein C has the structure:

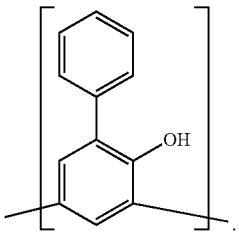

14. A process of coating a hard mask composition on a silicon substrate comprising:
- a3) applying a composition of claim 1 onto said silicon substrate to form a coating film,
- b3) baking the coating film to form a hard mask film,
- c3) coating a bottom antireflective coating on top of said hard mask film,
- d3) coating a photoresist on top of said antireflective coating,
- e3) patterning the photoresist to form a photoresist pattern,
- f3) etching through said bottom antireflective coating not protected by said photoresist pattern down to the hard mask coating with a fluorinated plasma,
- g3) etching through said hard mask film not protected by the bottom antireflective coating and said photoresist pattern down to the silicon substrate with a chlorine plasma producing a patterned hard mask film, and
- h3) etching with a fluorinated plasma into the silicon substrate in those area not protected by said patterned hard mask film producing topographical features into the silicon features.

15. The composition of claim 1, wherein A has the structure (XI):

 (XI)

wherein D is a group comprising 2-8 fused aromatic rings.

16. The composition of claim 15, wherein D is anthracene.

17. The composition of claim 1, wherein B has the structure:

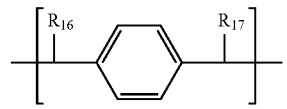

18. The composition of claim 17, wherein each of $R_{16}$ and $R_{17}$ is independently hydrogen or methyl.

19. A method of manufacturing an electronic device comprising:
- a) applying a composition of claim 1 onto a substrate to form a coating film; and
- b) heating the coating film at a temperature between 150° C. and 400° C. and for a time from 30 to 240 seconds, thereby forming a cured coating film.

20. The method according to claim 19, wherein the substrate comprises a topography comprising topographical features, and further comprising one or more of the steps of:
- c) removing the portion of said cured coating film overlaying a top of the topography using a chemical stripper or a fluorinated plasma etch, thereby producing filled topographical features wherein the cured coating film is flush with a top of said topographical features;
- d) removing said patterned organic high carbon coating or said patterned photoresist with an oxygen plasma, thereby forming a negative tone image of said patterned photoresist or said patterned organic high carbon coating, wherein, the remaining said filled topographic features, after removal of said patterned photoresist or said patterned organic high carbon coating, forms a pattern comprised of metal oxide; and
- e) using said pattern comprised of metal oxide as a patterned hard mask plasma etch barrier and etching into the semiconductor substrate with a fluorinated plasma.

21. The process according to claim 20, wherein said topographical features have an aspect ratio of 1:1 to 10:1.

22. The process according to claim 20, wherein said topographical features have an aspect ratio of 1 to 10 and are selected from ones that range in critical dimension (CD) from 10 nm to 100 nm.

* * * * *